United States Patent
Kawanami

(10) Patent No.: US 9,595,695 B2
(45) Date of Patent: Mar. 14, 2017

(54) METHOD FOR REMOVING IMPURITIES FROM INSIDE OF VACUUM CHAMBER, METHOD FOR USING VACUUM APPARATUS, AND METHOD FOR MANUFACTURING PRODUCT

(71) Applicant: JOLED INC., Tokyo (JP)

(72) Inventor: Yuko Kawanami, Osaka (JP)

(73) Assignee: JOLED INC., Tokyo (JP)

( * ) Notice: Subject to any disclaimer, the term of this patent is extended or adjusted under 35 U.S.C. 154(b) by 511 days.

(21) Appl. No.: 14/237,928

(22) PCT Filed: Jun. 6, 2013

(86) PCT No.: PCT/JP2013/003562
§ 371 (c)(1),
(2) Date: Feb. 10, 2014

(87) PCT Pub. No.: WO2013/187026
PCT Pub. Date: Dec. 19, 2013

(65) Prior Publication Data
US 2014/0202848 A1 Jul. 24, 2014

(30) Foreign Application Priority Data
Jun. 13, 2012 (JP) .................................. 2012-133827

(51) Int. Cl.
*H01L 51/56* (2006.01)
*C23C 14/56* (2006.01)
(Continued)

(52) U.S. Cl.
CPC ............ *H01L 51/56* (2013.01); *C23C 14/564* (2013.01); *H01L 51/0025* (2013.01); *H01L 51/0059* (2013.01); *H01L 51/50* (2013.01)

(58) Field of Classification Search
None
See application file for complete search history.

(56) References Cited

U.S. PATENT DOCUMENTS 5,443,922 A 8/1995 Nishizaki et al.
5,536,330 A 7/1996 Chen et al.
(Continued)

FOREIGN PATENT DOCUMENTS

JP 03-106432 5/1991
JP 05-163488 6/1993
(Continued)

OTHER PUBLICATIONS

U.S. Appl. No. 14/348,103 to Yuko Kawanami et al., which was filed on Mar. 28, 2014.
(Continued)

*Primary Examiner* — Nathan T Leong
(74) *Attorney, Agent, or Firm* — Greenblum & Bernstein, P.L.C.

(57) ABSTRACT

A method for using a vacuum apparatus that includes a vacuum chamber and a pump, the vacuum chamber housing an object, the pump reducing an internal pressure of the vacuum chamber, the method including: ventilating inside the vacuum chamber by introducing a gas into the vacuum chamber and discharging the gas from the vacuum chamber by causing the pump to reduce the internal pressure of the vacuum chamber. In the ventilating, a discharge rate at which molecules of the gas per unit volume are discharged is at least $3.3 \times 10^{-5}$ mol/(s·L), and the temperature in the vacuum chamber is at least 15° C. and at most 80° C.

20 Claims, 21 Drawing Sheets

(51) Int. Cl.
*H01L 51/00* (2006.01)
*H01L 51/50* (2006.01)

(56) References Cited

U.S. PATENT DOCUMENTS

| | | |
|---|---|---|
| 5,759,287 A | 6/1998 | Chen et al. |
| 2006/0182878 A1* | 8/2006 | Takaya .................... C23C 14/12 427/96.8 |
| 2009/0270289 A1* | 10/2009 | Moriizumi ................ C07F 9/02 508/370 |
| 2012/0018710 A1* | 1/2012 | Eida ...................... C07C 211/54 257/40 |

FOREIGN PATENT DOCUMENTS

| | | |
|---|---|---|
| JP | 06-063380 | 3/1994 |
| JP | 07-078775 | 3/1995 |
| JP | 07-227533 | 8/1995 |
| JP | 07227533 * | 8/1995 |
| JP | 2008-081673 | 4/2008 |
| JP | 2008-110932 | 5/2008 |
| JP | 2009-267299 | 11/2009 |
| WO | 2010/098023 | 9/2010 |

OTHER PUBLICATIONS

International Search Report (ISR) in International Patent Application No. PCT/JP2013/003562, dated Sep. 17, 2013.

* cited by examiner

Time A

Time B

Time C (a) Compound A (b) Compound B (d)

DPA (c) Compound C

Time A

Time B

Time C

METHOD FOR REMOVING IMPURITIES FROM INSIDE OF VACUUM CHAMBER, METHOD FOR USING VACUUM APPARATUS, AND METHOD FOR MANUFACTURING PRODUCT

TECHNICAL FIELD

The present invention relates to a technology for removing impurities from inside of the vacuum chamber.

BACKGROUND ART

A vacuum apparatus includes: a vacuum chamber having an accommodation space therein; and a vacuum pump for reducing the internal pressure of the vacuum chamber. The vacuum apparatus is often used in the intermediate procedure in the manufacturing process of various types of products. For example, the vacuum apparatus is used in the manufacturing process of an organic EL element that includes an organic EL layer, which emits electroluminescence by recombination of carriers, between the cathode and the anode (see, for example, Patent Literature 1).

The inside of the vacuum chamber of the vacuum apparatus is desirably not contaminated with impurities, namely, clean.

CITATION LIST

Patent Literature

Patent Literature 1: Japanese Patent Application Publication No. 2009-267299
Patent Literature 2: Japanese Patent Application Publication No. H7-78775

SUMMARY OF INVENTION

Technical Problem

It is therefore an object of the present invention to provide a method for removing impurities from a vacuum chamber, a method for using a vacuum apparatus, and a method for manufacturing a product.

Solution to Problem

According to one aspect of the present invention, there is provided a method for removing impurities from inside of a vacuum chamber, the method comprising: ventilating inside the vacuum chamber by introducing a gas into the vacuum chamber and discharging the gas from the vacuum chamber, wherein in the ventilating, a discharge rate at which molecules of the gas per unit volume are discharged is at least $3.3 \times 10^{-5}$ mol/(s·L), and the temperature in the vacuum chamber is at least 15° C. and at most 80° C. As used herein, "s" means second.

Advantageous Effects of Invention

The above-described method for removing impurities from the inside of a vacuum chamber, which is provided according to one aspect of the present invention, makes it possible to remove impurities from the inside of the vacuum chamber.

DESCRIPTION OF EMBODIMENTS

Outline of One Aspect of Invention

Figure 1:
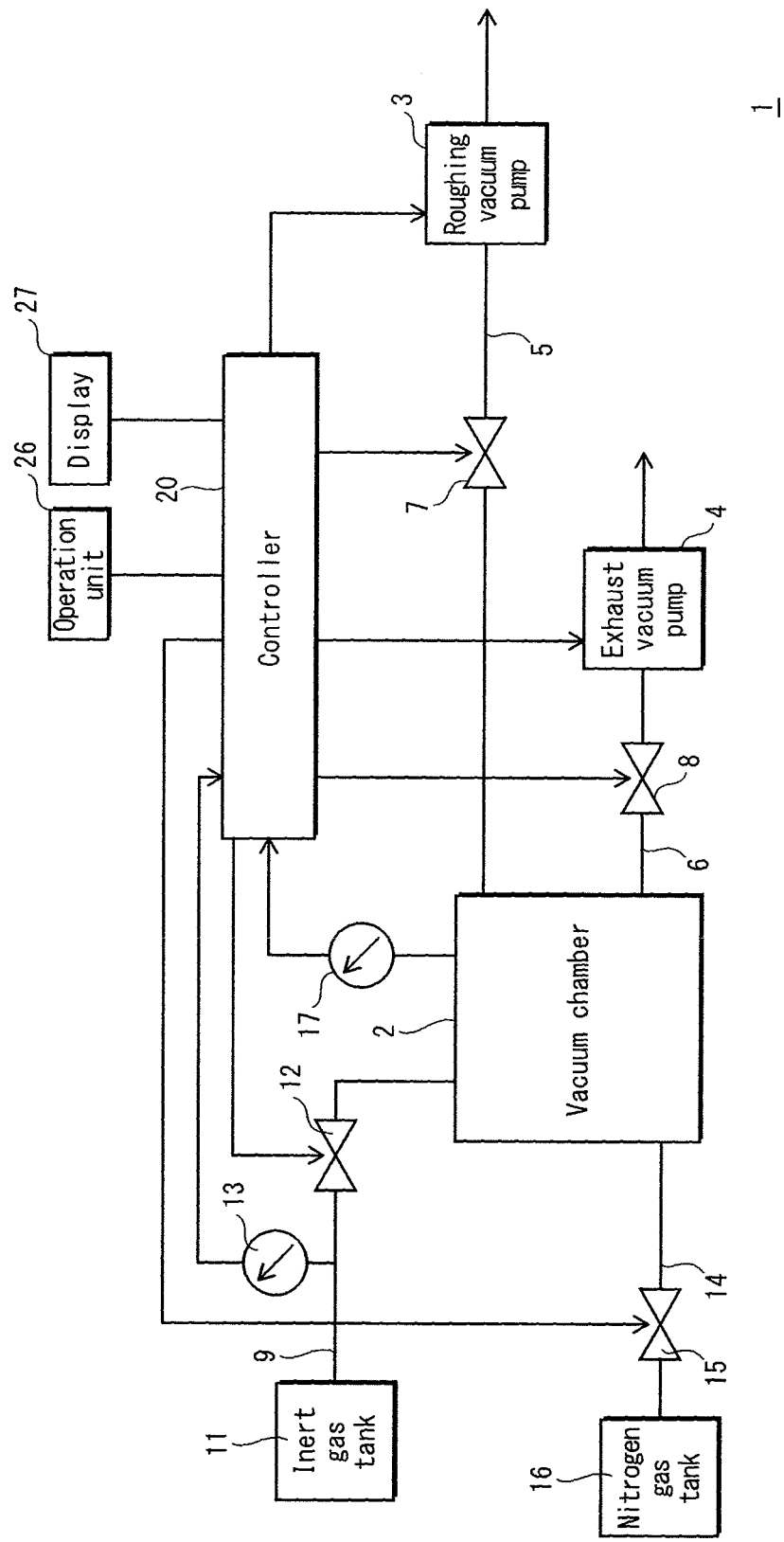
FIG. 1 is a diagram illustrating the structure of the vacuum apparatus in Embodiment 1.

According to one aspect of the present invention, there is provided a method for removing impurities from inside of a vacuum chamber, the method comprising: ventilating inside the vacuum chamber by introducing a gas into the vacuum chamber and discharging the gas from the vacuum chamber, wherein in the ventilating, a discharge rate at which molecules of the gas per unit volume are discharged is at least $3.3 \times 10^{-5}$ mol/(s·L), and the temperature in the vacuum chamber is at least 15° C. and at most 80° C.

In a predetermined situation of the method for removing impurities from inside of a vacuum chamber according to one aspect of the present invention, the discharge of the gas from the vacuum chamber is performed by a pump that reduces the internal pressure of the vacuum chamber. Also, the discharge rate at which molecules of the gas per unit volume are discharged may be at most $2.7 \times 10^{-3}$ mol/(s·L). Furthermore, the gas may be an inert gas.

In another predetermined situation of the method for removing impurities from inside of a vacuum chamber according to one aspect of the present invention, in the ventilating, the internal pressure of the vacuum chamber may be at least 250 Pa and less than the atmospheric pressure. Also, the ventilating may be performed for at least 20 minutes while the internal pressure of the vacuum chamber is set to a constant value of at least 250 Pa.

In a further predetermined situation of the method for removing impurities from inside of a vacuum chamber according to one aspect of the present invention, materials possessing diphenylamine moiety, which are the impurities, is used in at least one of the vacuum pump and a communication passage connecting the pump with the vacuum chamber.

According to another aspect of the present invention, there is provided a method for using a vacuum apparatus that includes a vacuum chamber and a pump, the vacuum chamber housing an object, the pump reducing an internal pressure of the vacuum chamber, the method comprising: ventilating inside the vacuum chamber by introducing a gas into the vacuum chamber and discharging the gas from the vacuum chamber by causing the pump to reduce the internal pressure of the vacuum chamber, wherein in the ventilating, a discharge rate at which molecules of the gas per unit volume are discharged is at least $3.3 \times 10^{-5}$ mol/(s·L), and the temperature in the vacuum chamber is at least 15° C. and at most 80° C.

In a predetermined situation of the method for using a vacuum apparatus according to another aspect of the present invention, the discharge rate at which molecules of the gas per unit volume are discharged is at most $2.7 \times 10^{-3}$ mol/(s·L). Also, the gas may be an inert gas. Furthermore, in the ventilating, the internal pressure of the vacuum chamber may be at least 250 Pa and less than the atmospheric pressure.

In another predetermined situation of the method for using a vacuum apparatus according to another aspect of the present invention, the object is an intermediate product in a manufacturing process of an organic EL display panel that includes a substrate and an organic functional film formed on the substrate, and is in a state where an organic applied film containing a solvent and an organic material for the organic functional film has been applied to the substrate, and the organic applied film is dried by causing the pump to reduce the internal pressure of the vacuum chamber while the object is housed in the vacuum chamber. Also, a material containing dephenylamine and its derivatives, which are the impurities, is used in at least one of the pump and a communication passage connecting the pump with the vacuum chamber.

According to a further aspect of the present invention, there is provided a method for manufacturing a product, the method comprising: reducing an internal pressure of a vacuum chamber by using a pump while an intermediate product, which is in an intermediate stage of a manufacturing process, is housed in the vacuum chamber; and ventilating inside the vacuum chamber by introducing a gas into the vacuum chamber and discharging the gas from the vacuum chamber, wherein in the ventilating, a discharge rate at which molecules of the gas per unit volume are discharged is at least $3.3 \times 10^{-5}$ mol/(s·L), and the temperature in the vacuum chamber is at least 15° C. and at most 80° C.

In a predetermined situation of the method for manufacturing a product according to the further aspect of the present invention, the product is an organic EL display panel that includes a substrate and an organic functional film formed on the substrate, the intermediate product is the substrate on which an organic applied film, which contains a solvent and an organic material for the organic functional film, has been formed, and the temperature in the vacuum chamber is at least 15° C. and at most 55° C.

In another predetermined situation of the method for manufacturing a product according to the further aspect of the present invention, a material containing diphenylamines, which are the impurities, is used in at least one of the pump and a communication passage connecting the pump with the vacuum chamber.

<<Process by which Inventor Reached One Embodiment of Invention>>

The inventor made a study on the light-emitting characteristics of the organic EL element. Through this study, the inventor found out that an organic EL element whose manufacturing process includes forming a film of an organic light-emitting layer and subjecting the intermediate product to a vacuum procedure is lower in light-emitting characteristics than an organic EL element manufactured without being subjected to the vacuum procedure.

The inventor further studied on the cause of the deterioration of the light-emitting characteristics observed in the organic EL element on which a vacuum procedure is performed in the manufacturing process, and reached a conclusion that the deterioration is caused because impurities (antioxidants), which are contained in the lubricant, sealing material (resin, rubber, etc.) or the like used in a vacuum pump, are diffused in the vacuum chamber and adsorbed to the organic light-emitting layer when the vacuum procedure is performed and the internal pressure of the vacuum chamber is reduced to ultimate vacuum of the vacuum pump.

It is therefore an object of one embodiment of the present invention to remove, in particular, antioxidants from the vacuum pumps, among the impurities in the vacuum chamber explained in the section "Technical Problem" above.

Embodiment 1

In the following description, references to specific materials, specific numerals and the like are provided. However, they are provided merely as preferable examples, and the invention is not limited thereto. Furthermore, the invention is capable of modification in various obvious respects, all without departing from the technical concept of the invention. It should also be noted that the accompanying drawings are not to scale.

1. Structure of Vacuum Apparatus

FIG. 1 illustrates the structure of the vacuum apparatus according to Embodiment 1.

A vacuum apparatus 1 in Embodiment 1 includes a vacuum chamber 2, a roughing vacuum pump 3, and a main exhaust vacuum pump 4. Note that the roughing vacuum pump 3 and the main exhaust vacuum pump 4 are pumps (so called "vacuum pumps") for reducing the internal pressure of the vacuum chamber 2.

The vacuum chamber 2 is a vessel for housing various intermediate products that are in an intermediate procedure (stage) of the manufacturing process.

The roughing vacuum pump 3 is, for example, a mechanical vacuum pump such as a rotary pump or a diaphragm pump. Among these, particularly a dry pump, which does not use pump oil, is preferable for use. This is because it keeps the inside of the vacuum chamber 2 clean.

The roughing vacuum pump 3 is connected to the vacuum chamber 2 via a roughing exhaust pipe 5. Note that the roughing vacuum pump 3 is used to reduce the internal pressure of the vacuum chamber 2 (also referred to as "internal pressure") to approximately 100 Pa.

The main exhaust vacuum pump 4 is a mechanical vacuum pump, more specifically a mechanical booster pump. The main exhaust vacuum pump 4 is connected to the vacuum chamber 2 via a main exhaust pipe 6. Note that the main exhaust vacuum pump 4 has capability to reduce the internal pressure of the vacuum chamber 2 to an approximate range from 0.6 Pa to 0.7 Pa.

The vacuum apparatus 1, when reducing the internal pressure of the vacuum chamber 2 to a vacuum state that is outside the performance of the roughing vacuum pump 3, first performs a rouging procedure by using the roughing vacuum pump 3 to reduce the internal pressure of the vacuum chamber 2 to the operation range of the main exhaust vacuum pump 4, and then a main exhaust procedure by using the main exhaust vacuum pump 4 to further reduce the internal pressure of the vacuum chamber 2.

A roughing valve 7 is attached to the roughing exhaust pipe 5, and a main exhaust valve 8 is attached to the main exhaust pipe 6. The roughing valve 7 opens or closes the roughing exhaust pipe 5 to unblock or block the flow from the vacuum chamber 2 to the roughing vacuum pump 3. The main exhaust valve 8 opens or closes the main exhaust pipe 6 to unblock or block the flow from the vacuum chamber 2 to the main exhaust vacuum pump 4.

Switching between the roughing vacuum pump 3 and the main exhaust vacuum pump 4 during reduction of the internal pressure of the vacuum chamber 2 may be performed by using the opening/closing of the roughing valve 7 and the main exhaust valve 8. For example, during the roughing procedure, the roughing vacuum pump 3 operates, and the roughing valve 7 is opened and the main exhaust valve 8 is closed; and during the main exhaust procedure, the main exhaust vacuum pump 4 operates, and the roughing valve 7 is closed and the main exhaust valve 8 is opened.

It should be noted here that a material containing diphenylamines is used in at least one of: a communication passage connecting the roughing vacuum pump 3 with the vacuum chamber 2; a communication passage connecting the main exhaust vacuum pump 4 with the vacuum chamber 2; the roughing vacuum pump 3; and the main exhaust vacuum pump 4. More specifically, a lubricant or the like containing diphenylamines is used in at least one of the roughing vacuum pump 3 and the main exhaust vacuum pump 4, and a vacuum sealing material or the like containing diphenylamines is used in at least one of the two communication passages. The communication passage connecting the roughing vacuum pump 3 with the vacuum chamber 2 includes the roughing exhaust pipe 5 and the roughing valve 7. The communication passage connecting the main exhaust vacuum pump 4 with the vacuum chamber 2 includes the main exhaust pipe 6 and the main exhaust valve 8.

In this example, the main exhaust pipe 6 is provided independently of the roughing exhaust pipe 5. However, an end of the main exhaust pipe 6 on the vacuum chamber 2 side may be connected to a portion of the roughing exhaust pipe 5 between the vacuum chamber 2 and the roughing valve 7.

The vacuum apparatus 1 has a function to introduce an inert gas into the vacuum chamber 2. More specifically, the vacuum chamber 2 is connected to an inert gas tank 11 via an inert gas introduction pipe 9. An inert gas introduction valve 12 is attached to the inert gas introduction pipe 9. The inert gas introduction valve 12 opens or closes the inert gas introduction pipe 9 to unblock or block the flow from the inert gas tank 11 to the vacuum chamber 2.

A pressure gauge 13 is attached to a portion between the inert gas tank 11 and the inert gas introduction valve 12. The inert gas introduction pressure in introduction to the vacuum chamber 2 is adjusted by the pressure gauge 13 and the inert gas introduction valve 12. The inert gas may be nitrogen, argon, or neon, for example. Also, dry air may be used as the inert gas, as well.

The vacuum chamber 2 is connected to a nitrogen gas introduction pipe 14 for introducing nitrogen gas into the vacuum chamber 2 (releasing the vacuum chamber 2 to the atmospheric pressure). A nitrogen gas introduction valve 15 is attached to the nitrogen gas introduction pipe 14. The nitrogen gas introduction valve 15 opens or closes the nitrogen gas introduction pipe 14 to unblock or block the flow from a nitrogen gas tank 16 to the vacuum chamber 2. Note that, when the nitrogen gas introduction valve 15 is maintained in an open state, the internal pressure of the vacuum chamber 2 becomes the same as the atmospheric pressure. When nitrogen gas is used as the inert gas, the nitrogen gas introduction pipe may be connected to the inert gas introduction valve 12 so that the nitrogen gas is introduced into the vacuum chamber 2 therefrom.

The inert gas or the dry air (hereinafter, also referred to as "inert gas or the like") may be used to finely adjust the pressure reduction speed in the vacuum chamber 2. That is to say, it is possible to decrease the pressure reduction speed in the vacuum chamber 2 by introducing the inert gas or the like into the vacuum chamber 2. The introduction of the inert gas is performed as necessary in such a case where it is difficult for only the roughing vacuum pump 3 to finely adjust the pressure reduction speed in the vacuum chamber 2

A pressure gauge 17 is attached to the vacuum chamber 2. The pressure gauge 17 measures the internal pressure, namely the degree of vacuum, of the vacuum chamber 2. As the pressure gauges 13 and 17, for example, a Pirani vacuum gauge, a diaphragm vacuum gauge, a spinning-rotor vacuum gauge or the like may be used.

The vacuum apparatus 1 includes: a controller 20 for performing an automatic reduction of the internal pressure of the vacuum chamber 2, an automatic introduction of the inert gas, or the like; an operation unit 26 used for the selection of a program, or the like; and a display 27 for displaying the program progress state, or the like.

Figure 2:
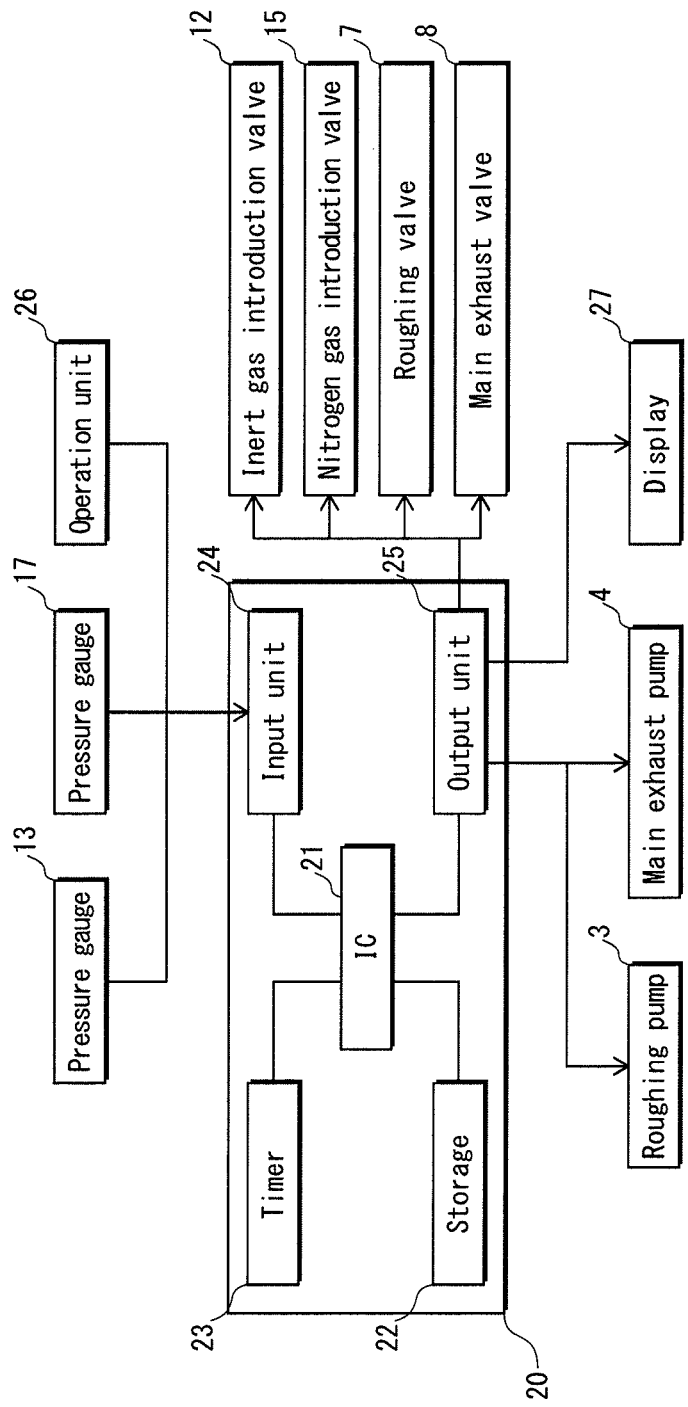
FIG. 2 is a block diagram of the controller.

FIG. 2 is a block diagram of the controller.

The controller 20 includes an IC (Integrated Circuit) 21, a storage 22, a timer 23, an input unit 24, and an output unit 25. The controller 20 is connected to the operation unit 26 via the input unit 24, and is connected to the display 27 via the output unit 25.

The IC 21, for example, receives various types of data and instructions via the input unit 24, outputs various instructions to the output unit 25, and executes various programs for operating the apparatus.

The data received via the input unit 24 includes, for example, program data input by the operator by using the operation unit 26, and data of the internal pressure of the vacuum chamber 2 that is input from the pressure gauges 13 and 17 to the input unit 24. The instructions received via the input unit 24 include, for example: an instruction to start or stop one of various programs such as a program for reducing the pressure or a program for introducing the inert gas or nitrogen gas; and an instruction to display the program progress state on the display 27 that is input by the operator when the operator wants to know the progress state of an executed program.

The instructions output from the output unit 25 include, for example: an instruction to activate a pump to reduce the internal pressure of the vacuum chamber 2 in accordance with an activated program; an instruction to open the inert gas introduction valve 12 to introduce the inert gas into the vacuum chamber 2; an instruction to open the nitrogen gas introduction valve 15 to release the vacuum chamber 2 to the atmospheric pressure; and an instruction to display various information on the display 27.

The various types of information displayed on the display 27 include, for example: progress state of an operation of the apparatus performed in accordance with a certain program; and contents of a program input by the operator.

The timer 23 counts various types of times. For example, upon receiving an instruction from the IC 21 while a program is running, the timer 23 starts counting a time, and outputs the counted time to the IC 21. The timer 23 also outputs the current time and the like to the IC 21. Note that the timer 23 may be an external apparatus to the controller 20, and may input times to the IC 21 via the input unit 24.

The storage 22 stores, for example, a program input by the operator by using the operation unit 26, and stores various types of settings.

The input unit 24 is connected to the pressure gauge 13 measuring an inert gas introduction pressure, the pressure gauge 17 measuring the internal pressure of the vacuum chamber 2, and the operation unit 26, and receives inputs from the pressure gauges 13 and 17 and operation unit 26 and outputs them to the IC 21.

The output unit 25 is connected to the roughing vacuum pump 3, main exhaust vacuum pump 4, inert gas introduction valve 12, nitrogen gas introduction valve 15, roughing valve 7, main exhaust valve 8, display 27, and the like, and in accordance with instructions from the IC 21, outputs open/close information to the valves 7, 8, 12 and 15, outputs start/stop information on the operation of the pumps 3 and 4, and outputs predetermined information to the display 27.

2. Operation of Controller (1) Refresh Process

The vacuum apparatus 1 may perform a refresh process for removing impurities from inside the vacuum chamber 2. In the refresh process, a ventilation procedure is performed to introduce a gas into the vacuum chamber 2 and discharge the gas from the vacuum chamber 2 via the roughing exhaust pipe 5. Note that the introduced gas passes (ventilates) through the vacuum chamber 2 and is discharged via the roughing exhaust pipe 5.

The gas to be introduced is, for example, a nitrogen gas. The gas is discharged from the vacuum chamber 2 at at least a predetermined discharge rate, which is $3.3 \times 10^{-5}$ mol/(s·L) when represented as a speed at which molecules of the gas per unit volume are discharged.

Figure 3:
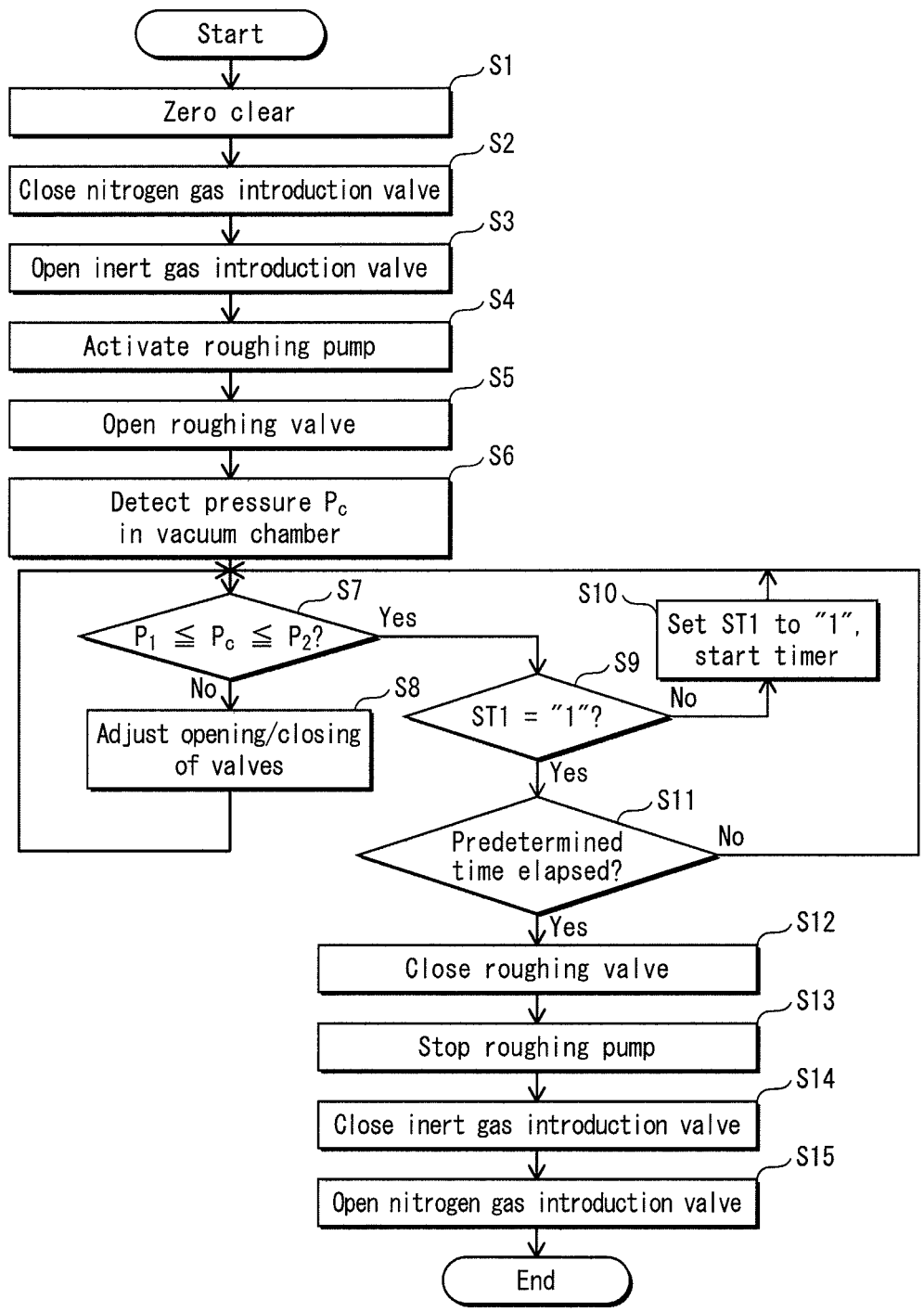
FIG. 3 is a flowchart provided for explanation of the operation of the controller.
Figure 4A:
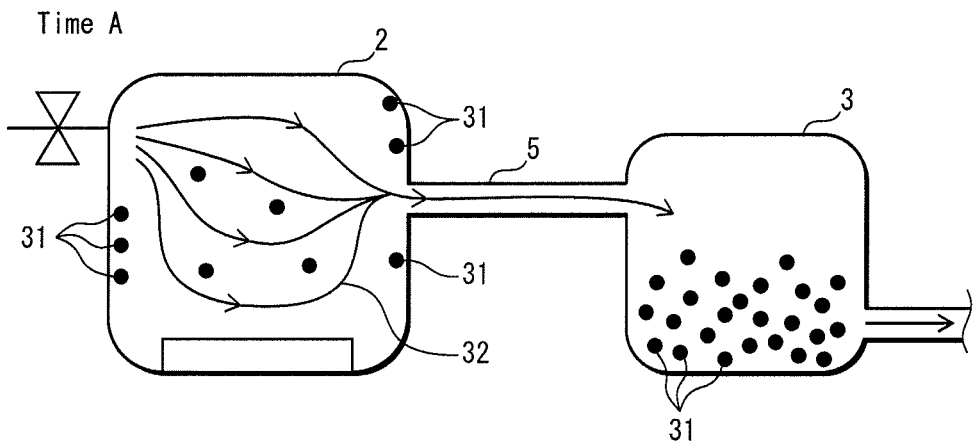
FIGS. 4A to 4C are diagrams schematically illustrating the situations inside the vacuum chamber and the roughing vacuum pump during the refresh process.
Figure 4B:
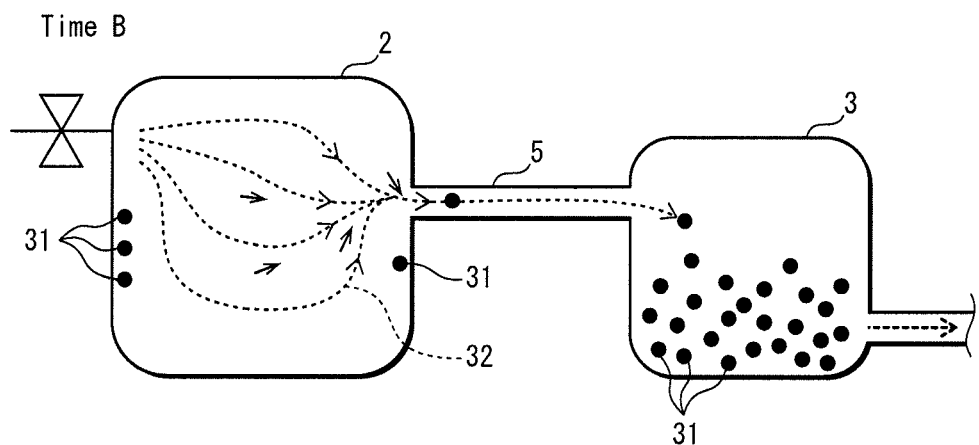
Figure 4C:
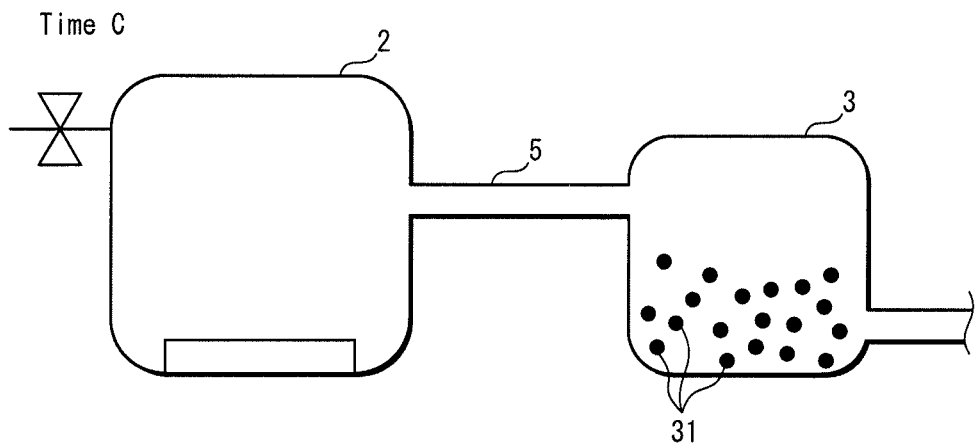

FIG. 3 is a flowchart provided for explanation of the operation of the controller. FIGS. 4A to 4C are diagrams schematically illustrating the situations inside the vacuum chamber and the roughing exhaust pipe during the refresh process.

When the controller 20 receives an input operation by the operator for activating a program for the refresh process (hereinafter, this program may also be referred to as a "removal program"), the removal program is started.

When the removal program is started, first the initial value is cleared to zero (S1). Subsequently, the nitrogen gas introduction valve 15 is closed to block the introduction of the nitrogen gas into the vacuum chamber 2 via the nitrogen gas introduction pipe 14 (S2: nitrogen gas introduction valve closing process). The inert gas introduction valve 12 is then opened to introduce the inert gas (nitrogen gas) into the vacuum chamber 2 via the inert gas introduction pipe 9 (S3: inert gas introduction valve opening process).

Subsequently, the roughing vacuum pump 3 is activated to reduce the internal pressure of the vacuum chamber 2 (S4: pump activation process). The roughing valve 7 is then opened to discharge the gas from the vacuum chamber 2 via the roughing exhaust pipe 5 connected to the roughing vacuum pump 3 (S5: roughing valve opening process).

With these processes, as illustrated in FIG. 4A, the inert gas (nitrogen gas) is introduced into the vacuum chamber 2, and with the pressure reduction caused by the roughing vacuum pump 3, the inert gas (nitrogen gas) is discharged, and inert gas (nitrogen gas) ventilates the vacuum chamber 2 (namely, an air flow 32 is generated).

Next, pressure Pc in the vacuum chamber 2 is detected from the pressure gauge 17 (S6: first internal pressure detection process). It is then judged whether or not the pressure Pc is within a predetermined range between set values P1 and P2 (S7: first internal pressure judgment process).

When it is judged that the pressure Pc is not within the predetermined range between set values P1 and P2 ("NO" in S7), the opening/closing of the inert gas introduction valve 12 and the roughing valve 7 is adjusted (S8: first valve adjustment process), and then the control returns to step S7. When it is judged that the pressure Pc is within the predetermined range between the set values P1 and P2 ("YES" in S7), it is judged whether or not ST1 is "1", wherein ST1 means a start of counting by the timer 23, and ST1=1 means that the counting has been started, and ST1=0 means that the counting has not been started (S9).

Note that, in this example, P1 is 250 Pa, and P2 is 101 kPa (atmospheric pressure).

When it is judged that ST1 is not "1", namely, ST1="0" ("NO" in S9), ST1 is set to "1", a counting by the timer 23 is started (S10: first count start process), and the control moves to step S7. When it is judged that ST1 is "1", namely, ST1="1" ("YES" in S9), it is judged whether or not the count value has exceeded a predetermined value representing a predetermined time period (S11: first elapsed time judgment process). Note that, in this example, the predetermined time period is, for example, 20 minutes.

When it is judged that the count value has not exceeded the predetermined value representing the predetermined time period ("NO" in S11), the control returns to step S7. At this time, as illustrated in FIG. 4B, in the vacuum chamber 2, due to the air flow 32 of the inert gas (nitrogen gas), impurities 31 adsorbed to the inner wall of the vacuum chamber 2 are removed therefrom and discharged to a roughing vacuum pump 3 side.

When it is judged that the count value has exceeded the predetermined value representing the predetermined time period ("YES" in S11), the roughing valve 7 is closed (roughing valve closing process), the roughing vacuum pump 3 is stopped (pump stop process), the inert gas introduction valve 12 is closed (inert gas introduction valve closing process), then nitrogen gas introduction valve 15 is opened (nitrogen gas introduction valve opening process), and the operation ends (S12 to S15).

At this time, as illustrated in FIG. 4C, in the vacuum chamber 2, due to the air flow 32 of the inert gas (nitrogen gas), the impurities 31 that have adsorbed to the inner wall of the vacuum chamber 2 are removed, that is to say, impurities are removed from the vacuum chamber 2.

As described above, the ventilation process allows for impurities to be removed from inside the vacuum chamber 2. This process does not require any special apparatus and can easily remove the impurities that are generated by the backflow diffusion from the pump side.

Patent Literature 2 discloses a technology for removing impurities by using a gas that has been heated to at least 90° C. However, in the refresh process, it is not preferable to heat inside the vacuum chamber 2 unnecessarily. The temperature in the vacuum chamber 2 is desirably at least 15° C. and at most 80° C., and is more desirably at least 20° C. and at most 35° C.

By setting the temperature inside the vacuum chamber 2 to such a range, it is possible to prevent impurity gas (outgas) containing water, organic materials or the like from being discharged from organic members (members made of organic materials) among the members constituting the pumps (the roughing vacuum pump 3 and the main exhaust vacuum pump 4) and the vacuum chamber 2. This makes it possible to prevent contamination of the pumps, vacuum chamber, and communication passages connecting these.

Also, by preventing unnecessary heating of the parts made from organic materials, it is possible to restrict deterioration of the organic materials. This allows for the vacuum chamber to maintain vacuum for a long time period, prevents the organic parts exchange cycle from being shortened, and allows for the maintenance cost required to maintain the vacuum in the vacuum apparatus 1 to be restricted.

(2) Drying Process (Including Refresh Process)

The following explains the drying process that is one example of the usage of the vacuum apparatus 1. More specifically, the following explains the case where the vacuum apparatus 1 perfoinis a drying process for drying an organic light-emitting layer of an organic EL display panel.

In the following explanation, the product is the organic EL display panel, and the intermediate product is composed of a substrate on which an organic light-emitting material applied film containing a solvent and an organic material for the organic light-emitting layer has been applied. Note that the organic EL display panel is described in detail below.

Figure 5:
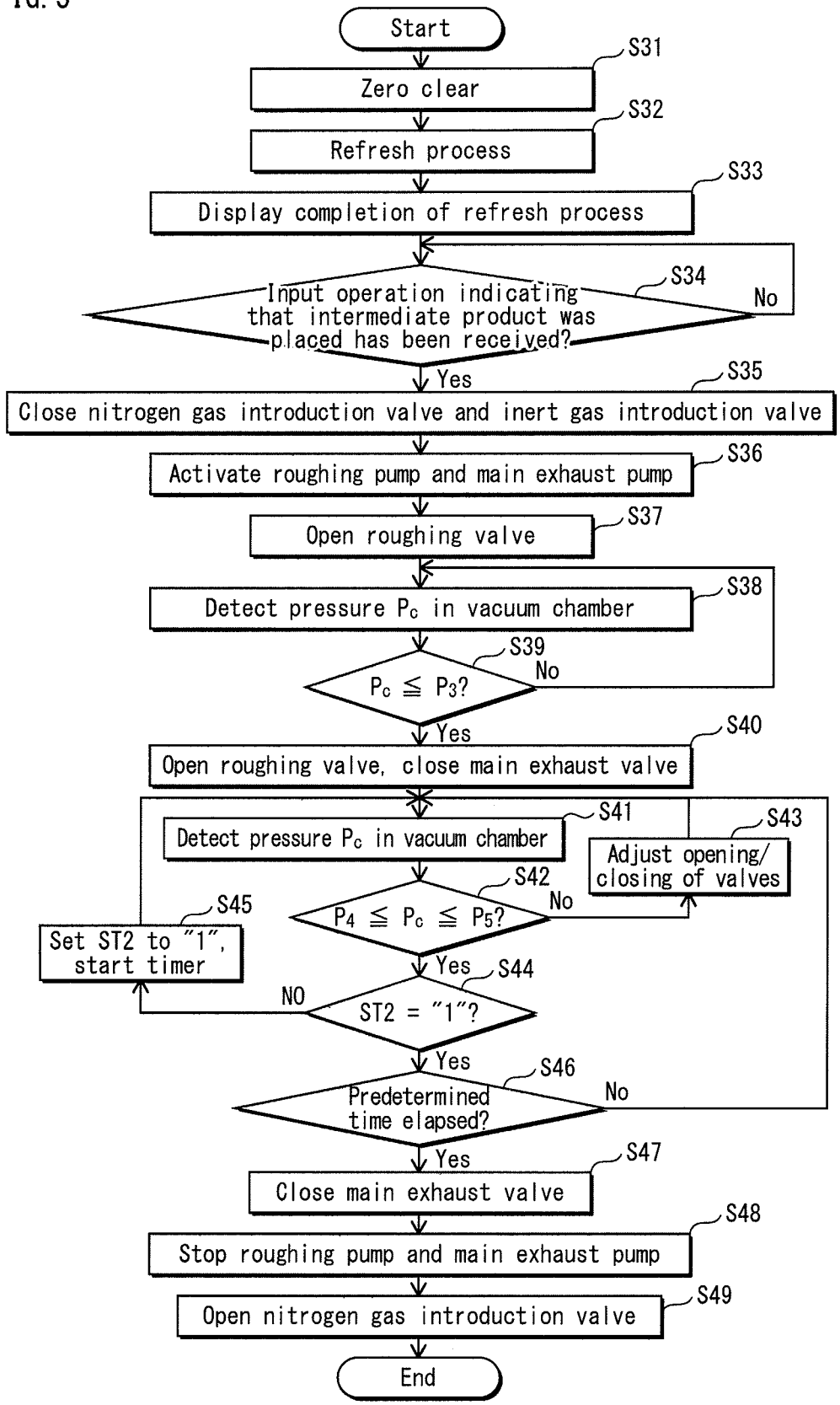
FIG. 5 is a flowchart provided for explanation of the operation of the controller.

FIG. 5 is a flowchart provided for explanation of the operation of the controller.

When the controller 20 receives an input operation by the operator for activating a program for the drying process (hereinafter, this program may also be referred to as a "drying program"), the drying program is started.

When the drying program is started, first a zero clear is performed (S31). Subsequently, the refresh process is performed to refresh the inside of the vacuum chamber 2 (S32). The refresh process performed here is the same as that explained above. After the refresh process is completed (namely, when the door of the vacuum chamber 2 can be opened), the completion of the refresh process is displayed on the display 27 (S33).

With this display, the operator can recognize the timing for placing the intermediate product in the vacuum chamber 2.

Subsequently, it is judged whether or not an input operation, which is performed by the operator to indicate that the intermediate product was placed in the vacuum chamber 2, has been received from the operation unit 26 (S34: intermediate product placement judgment process). When it is judged that the input operation has been received ("YES" in S34), the nitrogen gas introduction valve 15 and the inert gas introduction valve 12 are closed to reduce the internal pressure of the vacuum chamber 2 (S35: air/inert gas introduction valve closing process), and the roughing vacuum pump 3 and the main exhaust vacuum pump 4 are activated (S36: pump activation process).

Next, the roughing valve 7 is opened (S37: roughing valve opening process), the pressure Pc in the vacuum chamber 2 is detected from the pressure gauge 17 (S38: second internal pressure detection process), and it is judged whether or not the pressure Pc ≤ the set value P3 (S39: second internal pressure judgment process).

When it is judged that the pressure Pc ≤ the set value P3 ("YES" in S39), the roughing valve 7 is closed and the main exhaust valve 8 is opened (S40) to switch from the roughing vacuum pump 3 to the main exhaust vacuum pump 4 (pump switching process). Note that in this example, the set value P3 is, for example, 100 Pa.

Subsequently, the pressure Pc in the vacuum chamber 2 is detected from the pressure gauge 17 (S41: third internal pressure detection process), and it is judged whether or not the pressure Pc is within a predetermined range between set values P4 and P5 (S42: third internal pressure judgment process).

When it is judged that the pressure Pc is not within the predetermined range between set values P4 and P5 ("NO" in S42), the opening/closing of the inert gas introduction valve 12 and the roughing valve 7 is adjusted (S43: second valve adjustment process), and then the control returns to step S41.

When it is judged that the pressure Pc is within the predetermined range between the set values P4 and P5 ("YES" in S42), it is judged whether or not ST2 is "1", wherein ST2 means a start of counting by the timer 23, and ST2=1 means that the counting has been started, and ST2=0 means that the counting has not been started (S44). Note that in this example, the set value P4 is, for example, at least 0.6 Pa and at most 0.7 Pa, and the set value P5 is, for example, 15 Pa. Note that this predetermined range is a range of internal pressures that may generate a backflow diffusion of impurities from the main exhaust vacuum pump 4 into the vacuum chamber 2. However, the internal pressure may not necessarily be reduced to a pressure at which the backflow diffusion may occur, but the degree of valcuum to be reached may be determined as necessary.

When ST2 is not "1", namely, ST2=0 ("NO" in S44), ST2 is set to "1", a counting by the timer 23 is started (S45: second count start process), and the control moves to step S41.

When it is judged that ST2 is 1, namely, ST2=1 ("YES" in S44), it is judged whether or not the count value has exceeded a predetermined value representing a predetermined time period (S46: second elapsed time judgment process). Note that, in this example, the predetermined time period is, for example, 20 minutes.

When it is judged that the count value has not exceeded the predetermined value representing the predetermined time period ("NO" in S46), the control returns to step S41. When it is judged that the count value has exceeded the predetermined value representing the predetermined time period ("YES" in S46), the main exhaust valve 8 is closed (main exhaust valve closing process), the roughing vacuum pump 3 and the main exhaust vacuum pump 4 are stopped (second pump stop process), the initrogen gas introduction valve 15 is opened (nitrogen gas introduction valve opening process), and the operation ends (S47 to S49).

In the drying process, the refresh process is performed and then the intermediate product is placed in the vacuum chamber 2 for the organic light-emitting material applied film to be dried. This reduces the amount of impurities that are present in the vacuum chamber 2 to a level that would not affect the device performance, thereby restricting the impurities from adhering to the organic light-emitting layer.

The refresh process (S32) may be performed immediately before the process of step S47, or may be performed in step S32 and then further performed immediately before step S47

In the drying process, the temperature in the vacuum chamber 2 is desirably at least 15° C. and at most 55° C., and is more desirably at least 20° C. and at most 35° C. By setting the temperature like this, the advantageous effect explained with regard to the refresh process can be obtained in the similar way.

Furthermore, in the drying process, an organic light-emitting application liquid containing a solvent and an organic material for the organic light-emitting layer is dried. In this drying, when the light-emitting characteristics of the organic EL display panel is taken into account, the temperature in the vacuum chamber 2 is more desirably at least 15° C. and at most 55° C. This is based on the following reasons. Since the light-emitting characteristics of the organic EL display panel are easily influenced by the cross-sectional shape of the organic light-emitting layer, the organic light-emitting layer is desirably as flat as possible in cross section. As a result of intense study, the inventor of the present invention discovered that, in the vacuum drying of the organic light-emitting material applied film, control of the cross-sectional shape is influenced by the temperature in the vacuum state.

By setting the temperature in the vacuum chamber 2 to at least 15° C. and at most 55° C., it is possible to prevent the liquid containing organic light-emitting material from decreasing in viscosity. This causes a weaker convection to occur in the liquid during the drying process and prevents the organic material (solute) for the organic light-emitting layer from flowing to the peripheral edge region of the application region in which the liquid is applied. This makes it possible to obtain a highly flat organic light-emitting layer. Furthermore, setting the temperature in the vacuum chamber 2 to at least 20° C. and at most 35° C. makes it possible to obtain a more highly flat organic light-emitting layer.

(3) Drying Process (not Including Refresh Process)

In the drying process described in (2) above, the refresh process is included. However, the drying process may not include the refresh process. That is to say, the drying process and the refresh process may be performed independently of each other. In that case, in the drying process described in (2) (see FIG. 5) above, steps S32 to S34 may be omitted, and the control may move from step S31 to step S35.

When the refresh process and the drying process are performed independently of each other, after the inside of the vacuum chamber 2 is purified through the refresh process, the liquid including the organic light-emitting material may be dried in the drying process. With this method, the drying process of the liquid can be performed in the purified vacuum chamber 2, so that an organic light-emitting layer with excellent light-emitting characteristics can be obtained. In that case, if the purpose is only to obtain a highly flat organic light-emitting layer, the refresh process may be performed at a temperature higher than 55° C., and the drying process of the liquid including organic light-emitting magterial may be performed at a temperature of at least 15° C. and at most 55° C. However, this method has a problem that, since the drying process is performed after the refresh process, it is necessary to wait for the vacuum chamber 2 to cool and it takes time to form the organic light-emitting layer.

For this reason, when the refresh process and the drying process are performed independently of each other, it is preferable that the refresh process is performed in the vacuum chamber 2 at a temperature of at least 15° C. and at most 80° C., and the drying process is performed in the vacuum chamber 2 at a temperature of at least 15° C. and at most 55° C. It is more preferable that both processes are performed at a temperature of at least 15° C. and at most 55° C., and it is further more preferable that both processes are performed at a temperature of at least 20° C. and at most 35° C. When the temperatures of these processes are closer to each other, a quicker transition from the refresh process to the drying process is possible.

Embodiment 2

Embodiment 2 describes an organic EL element including an organic light-emitting layer formed by using the vacuum apparatus of Embodiment 1, and an organic EL display panel including a plurality of organic EL elements.

1. Structure of Organic EL Display Panel

Figure 6:
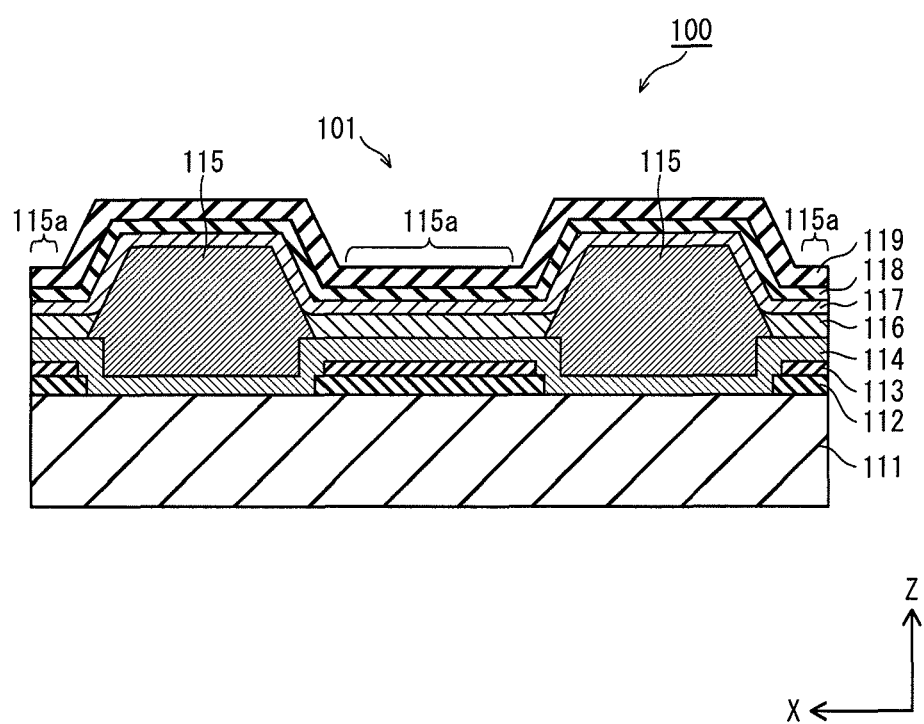
FIG. 6 is a partial cross-sectional view illustrating the structure of an organic EL display panel.

FIG. 6 is a partial cross-sectional view illustrating the structure of an organic EL display panel 100. The organic EL display panel 100 is a so-called top-emission organic EL display panel where a display surface is provided on the upper side thereof as illustrated in FIG. 6, and the main structural elements include anodes 112, organic light-emitting layers 116, an electron transport layer 117, and a cathode 118.

In the organic EL display panel 100, each of a plurality of organic EL elements 101, which includes one organic light-emitting layer 116 that corresponds to one of luminescent colors red (R), green (G), and blue (B), is treated as one sub-pixel, and a plurality of sub-pixels are arranged in a matrix. Note that FIG. 6 is also an enlargement of organic EL elements 101. Note further that one pixel is composed of three sub-pixels.

(1) Substrate 111, Anodes 112, ITO Layers 113

The substrate 111 is a base member of the organic EL display panel 100 and may be formed from any of insulating materials: alkali-free glass, soda glass, non-fluorescent glass, phosphate glass, borate glass, quartz, acrylic resin, styrenic resin, polycarbonate resin, epoxy resin, polyethylene, polyester, silicone resin, alumina, etc.

Although not illustrated, a thin-film transistor (TFT) for driving the organic EL elements 101 is provided on the surface of the substrate 111, and the anodes 112 are provided on the TFT. The anodes 112 may be formed from, for example, ACL (an alloy of aluminum, cobalt and lanthanum), APC (an alloy of silver, palladium and copper), ARA (an alloy of silver, rubidium and gold), MoCr (an alloy of molybdenum and chromium), NiCr (an alloy of nickel and chromium), etc.

The ITO (Indium Tin Oxide) layers 113 is provided between the anodes 112 and a hole injection layer 114, and has a function to provide excellent connection between the layers.

(2) Hole Injection Layer 114

The hole injection layer 114 is a layer formed from, for example, an oxide of silver (Ag), molybdenum (Mo), chromium (Cr), vanadium (V), tungsten (W), nickel (Ni), iridium (Ir), etc., or a conductive polymer material such as PEDOT (a mixture of polythiophene and polystyrene sulfonate). When formed from a metal oxide among the above-mentioned materials, the hole injection layer 114 has a function to inject holes into the organic light-emitting layers 116 stably or by assisting with generation of holes.

(3) Banks 115

On the surface of the hole injection layer 114, banks 115 are formed to demarcate openings 115a below which the organic light-emitting layers 116 are formed, respectively. The banks 115 are formed to have a predetermined trapezoidal shape in cross section, and made of an insulating organic material (e.g., acrylic resin, polyimide resin, novolac-type phenolic resin, etc.).

(4) Organic Light Emitting Layers 116

On the surface of each region of the hole injection layer 114 in each opening 115a demarcated by the banks 115, one organic light-emitting layer 116 (an organic film) corresponding to any of luminescent colors R, G and B is formed. Each organic light-emitting layer 116 emits light by recombination of carriers, and contains an organic material corresponding to any of the colors R, G and B.

Examples of the materials that can be used in the organic light-emitting layers 116 include F8-F6 which was used in the experiment explained below, poly-para-phenylene vinylene (PPV), polyfluorene, and fluorescent materials described in Japanese Patent Application Publication No. H5-163488 such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group III metal, metal complex of oxine, rare earth metal complex, etc.

The organic light-emitting layers 116 of Embodiment 2 are formed (dried) by using the vacuum apparatus of Embodiment 1, and thus have excellent light-emitting characteristics.

(5) Electron Transport Layer 117

The electron transport layer 117 has a function to transport electrons, which are injected from the cathode 118, to the organic light-emitting layers 116. The electron transport layer 117 is formed from a material having electron transportability (electron transporting material), and examples of the electron transporting materials include nitro-substituted fluorenone derivative, thiopyran dioxide derivative, diphenoquinone derivative, perylenetetracarboxyl derivative, anthraquinodimethane derivative, fluorenylidenemethane derivative, anthrone derivative, oxadiazole derivative, perynone derivative, quinolone complex derivative, etc., as described in Japanese Patent Application Publication No. H5-163488.

(6) Cathode 118

In the present embodiment, to realize a top-emission organic EL display panel, the cathode 118, which is formed on the electron transport layer 117, may be made of a light-transmissive, conductive oxide such as ITO or IZO (Indium Zinc Oxide).

(7) Sealing Layer 119

A sealing layer 119 is formed on the cathode 118 to protect the organic light-emitting layers 116 and the cathode 118 from water or oxygen that may penetrate into the organic EL display panel 100. Since the organic EL display panel 100 is a top-emission type, the sealing layer 119 may be formed from a light-transmissive material such as SiN (silicon nitride) or SiON (silicon oxynitride).

(8) Others

Although not illustrated in particular, a sealing substrate may be provided above the sealing layer 119 so as to be facing the substrate 111. Furthermore, a space formed between the sealing layer 119 and the sealing substrate may be filled with an insulative material. This structure prevents water or oxygen from penetrating into the organic EL display panel 100. Since the organic EL display panel 100 is a top-emission type, the insulative material needs to be a light-transmissive material such as SiN or SiON.

Furthermore, a hole transport layer, which has a function to promote transportation of holes from the hole injection layer 114 to the organic light-emitting layer 11, may be formed between the hole injection layer 114 and the organic light-emitting layers 116. Examples of possible materials of the hole transport layer include triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound, styrylamine compound, butadiene compound, polystyrene derivative, hydrazone derivative, triphenylmethane derivative, tetraphenyl benzine derivative, etc. as described in Japanese Patent Application Publication No. H5-163488.

Furthermore, an electron injection layer, which has a function to promote injection of electrons from the cathode 118 to the electron transport layer 117, may be formed between the electron transport layer 117 and the cathode 118. Examples of possible materials of the electron injection layer include barium, phthalocyanine, lithium fluoride, etc.

2. Manufacturing Method of Organic EL Display Panel

FIGS. 7A-9B are diagrams illustrating an example of the manufacturing process of the organic EL display panel 100 of Embodiment 2. The following describes the manufacturing process of the organic EL display panel 100 with reference to these drawings.

(1) Preparation Procedure

First, a preparation procedure for preparing the substrate 111 is performed, wherein the anodes 112 are formed on the upper surface of the substrate 111, and an organic light-emitting material applied film containing a solvent and an organic material constituting the organic light-emitting layers 116 is formed above the anodes 112. Note that FIGS. 7A-8A correspond to the preparation procedure, and the organic light-emitting material applied film corresponds to the "organic applied film".

Figure 7A:
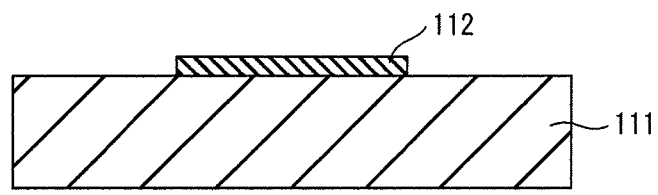
FIGS. 7A-7C are diagrams illustrating an example of the manufacturing process of the organic EL display panel of Embodiment 2.

First, as illustrated in FIG. 7A, the substrate 111 is placed in a film-forming vessel of a sputter film-forming apparatus. A predetermined sputtering gas is introduced into the film-forming vessel, and the anodes 112 are formed by the reactive sputtering method, vacuum deposition method or the like.

Figure 7B:
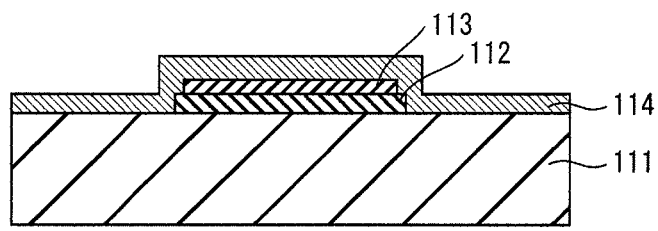

Subsequently, in the film-forming vessel, as illustrated in FIG. 7B, the ITO layers 113 are respectively formed on the anodes 112 by the sputtering method. Next, a metal film is formed by the sputtering method or the like to cover the surface of the substrate 111 including the surfaces of the ITO layers 113. Subsequently, the hole injection layer 114 is formed by oxidizing the formed metal film.

Figure 7C:
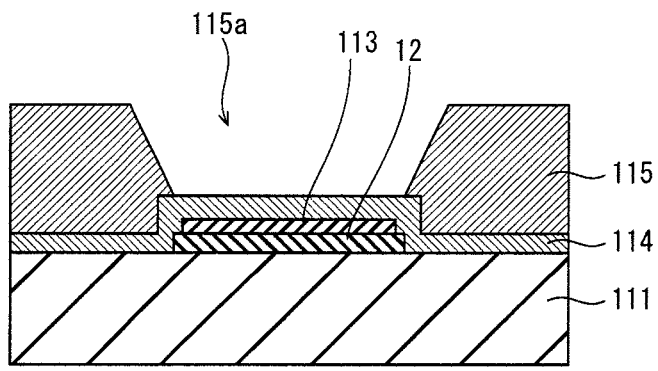

Next, as illustrated in FIG. 7C, the banks 115 are formed. As the bank material, for example, a photosensitive resist material, preferably a photoresist material containing a fluorine-based material, is prepared. The bank material is uniformly applied to the surface of the hole injection layer 114. The applied bank material is pre-baked, and then a mask with a pattern for forming the openings 115a is overlaid thereon. Subsequently, the hole injection layer 114 with the mask thereon is exposed to light, then unhardened portions of the bank material are washed away by developer. The resultant is cleaned with pure water and the banks 115 are completely formed.

Figure 8A:
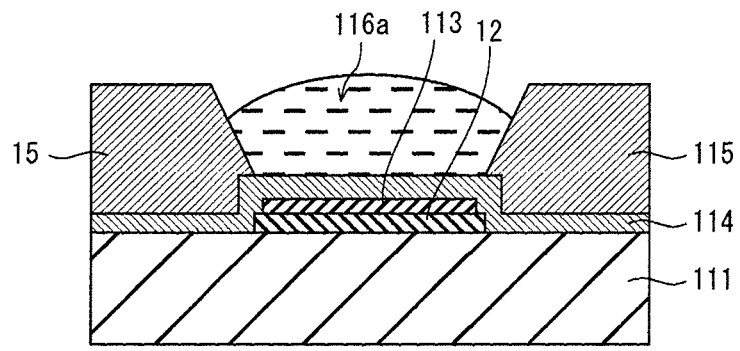
FIGS. 8A-8C are diagrams illustrating an example of the manufacturing process of the organic EL display panel of Embodiment 2.
Figure 8B:
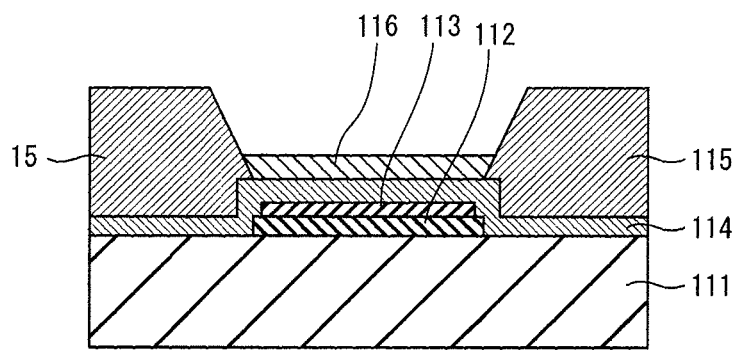

Subsequently, as illustrated in FIG. 8A, an organic light-emitting application liquid containing a solvent and an organic light-emitting material constituting the organic light-emitting layers 116 is dropped by the ink jet method into the openings 115a demarcated by the banks 115 (see FIG. 7C). With the procedure described above, the substrate 111 is prepared, wherein the anodes 112 are formed on the upper surface of the substrate 111, and an organic light-emitting material applied film containing a solvent and an organic material constituting the organic light-emitting layers 116 is formed above the anodes 112. With this, the intermediate product is obtained.

Note that the method for applying the liquid including organic light-emitting material is not limited to the ink jet method, but may be, for example, the gravure printing method, dispenser method, nozzle coat method, intaglio printing, letterpress printing or the like.

Note that the "substrate with anodes formed thereon where an organic light-emitting material applied film containing a solvent and an organic light-emitting material constituting the organic light-emitting layer" includes not only a substrate where the organic light-emitting material applied film is formed directly on the anodes, but also a substrate where the organic light-emitting material applied film is formed indirectly above the anodes. That is to say, another layer may be provided between the anodes and the applied organic light-emitting material applied film. In the case of the substrate prepared in the preparation procedure of the present embodiment, the ITO layers 113 and the hole injection layer 114 are provided between the anodes 112 and the organic light-emitting material applied film 116a.

(2) Drying Procedure

In the drying procedure (FIG. 8B), the organic light-emitting material applied film 116a is dried based on the vacuum apparatus 1 and the drying program of Embodiment 1. More specifically, the substrate 111 (intermediate product) with the organic light-emitting material applied film 116a formed thereabove is placed in the vacuum chamber 2 that has been cleaned by the refresh process, and the organic light-emitting material applied film is dried while maintaining the vacuum state in the vacuum chamber 2 by the roughing vacuum pump 3 and the main exhaust vacuum pump 4 connected to the vacuum chamber 2.

Note that in Embodiment 2, the "organic light-emitting material applied film" is assumed to turn into the organic light-emitting layers 116 by passing through the drying procedure.

After the refresh process, the amount of impurities that exist (remain) in the vacuum chamber 2 has been reduced to as small as not affecting the performance. With this method, the amount of impurities in the vacuum chamber 2 that adhere to the surface of the organic light-emitting layers 116 can be reduced to a level that does not affect the device performance.

The drying procedure of Embodiment 2 includes: a roughing procedure for reducing the internal pressure of the vacuum chamber 2 to less than 100 Pa by the roughing vacuum pump 3; and a main exhaust procedure, performed after the roughing procedure, for reducing the internal pressure of the vacuum chamber 2 to at least 0.6 Pa and at most 15 Pa by the main exhaust vacuum pump 4.

(3) Electron Transport Layer Forming Procedure, Cathode Forming Procedure, Etc.

Figure 8C:
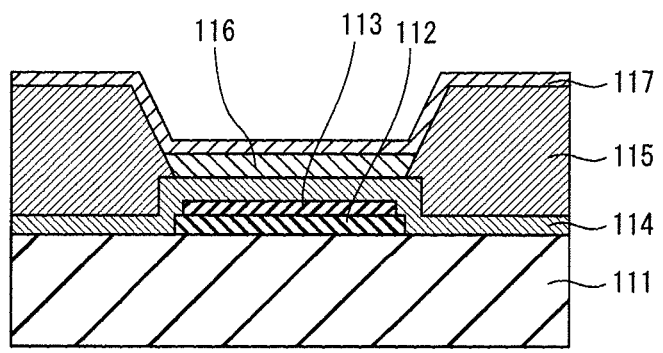

After the drying procedure, as illustrated in FIG. 8C, the electron transport layer 117 is formed on the organic light-emitting layers 116 by the vacuum film-forming method. More specifically, the electron transport layer 117 is formed by forming a film made of a material constituting the electron transport layer 117 on the upper surface of the organic light-emitting layers 116 by the vacuum film-forming method such as the vacuum deposition method, sputtering method or the like.

Figure 9A:
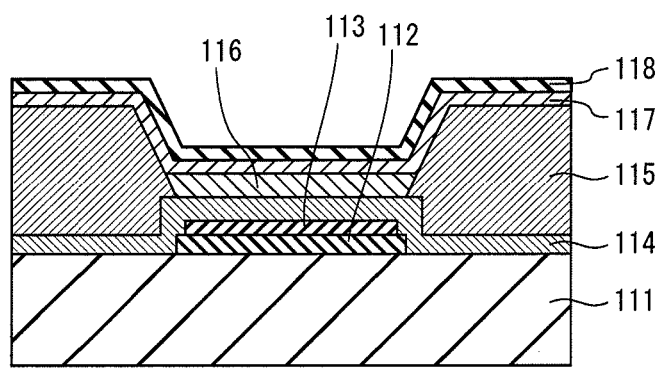
FIGS. 9A-9B are diagrams illustrating an example of the manufacturing process of the organic EL display panel of Embodiment 2.

Next, the cathode forming procedure is performed (FIG. 9A). In the cathode forming procedure, the cathode 118 is formed by forming a film of ITO, IZO or the like above the organic light-emitting layers 116, an applied film, by the vacuum film-forming method such as the vacuum deposition method, sputtering method or the like.

Note that the "cathode formed above the organic light-emitting layer" includes not only a cathode formed directly on the organic light-emitting layer, but also a cathode formed indirectly above the organic light-emitting layer. That is to say, a procedure for forming another layer may be performed after the drying procedure and before the cathode forming procedure. When a procedure for forming another layer is performed after the drying procedure and before the cathode forming procedure, the other layer is included between the applied film and the cathode in the intermediate product of the organic EL element after the cathode is formed.

Note that in the intermediate product of the organic EL element in the present embodiment, the electron transport layer 117 is included between the organic light-emitting layers 116 and the cathode 118. As a result, the cathode 118 is formed on the upper surface of the electron transport layer 117.

Figure 9B:
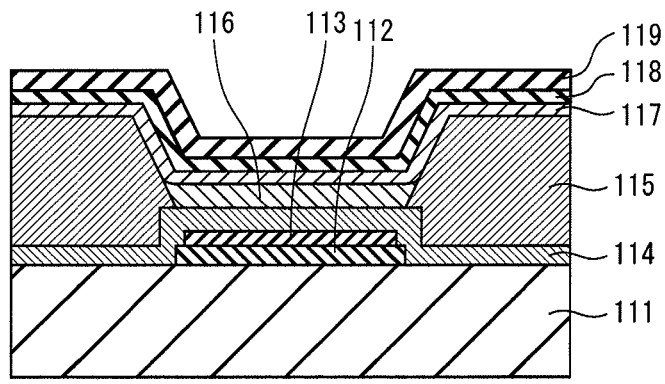

After the cathode forming procedure is completed, the sealing layer 119 is formed on the cathode 118 by the vacuum deposition method, sputtering method or the like, as illustrated in FIG. 9B. Subsequently, the sealing substrate is placed above and opposite the sealing layer 119, and, as necessary, a space formed between the sealing layer 119 and the sealing substrate is filled with an insulative material.

The organic EL device display panel 100 is completed through the above-described procedures.

3. Impurities

The refresh process is performed to remove impurities from the vacuum chamber 2 by introducing a gas into the vacuum chamber 2 and discharging the gas, namely by causing the gas to ventilate the vacuum chamber 2. The ventilation of the gas is defined by the amount of exhaust gas. The following describes the relationship between the amount of exhaust gas and remaining impurities.

(1) Internal Pressure

The inventor manufactured samples of organic EL elements by varying the amount of introduced/exhaust gas during the drying procedure of the organic light-emitting material applied film 116a, and evaluated the manufactured samples of organic EL elements. Note that, at the time of the experiment, the inventor had already found that the impurities adsorbed to the organic light-emitting layer would reduce the luminance maintenance rate prominently.

The ventilation of the gas was performed under two types of internal pressures of the vacuum chamber 2, namely 250 Pa and 10 Pa. Note that in all manufacturing processes, the ventilation (exhaust) was performed for 20 minutes.

Figure 10A:
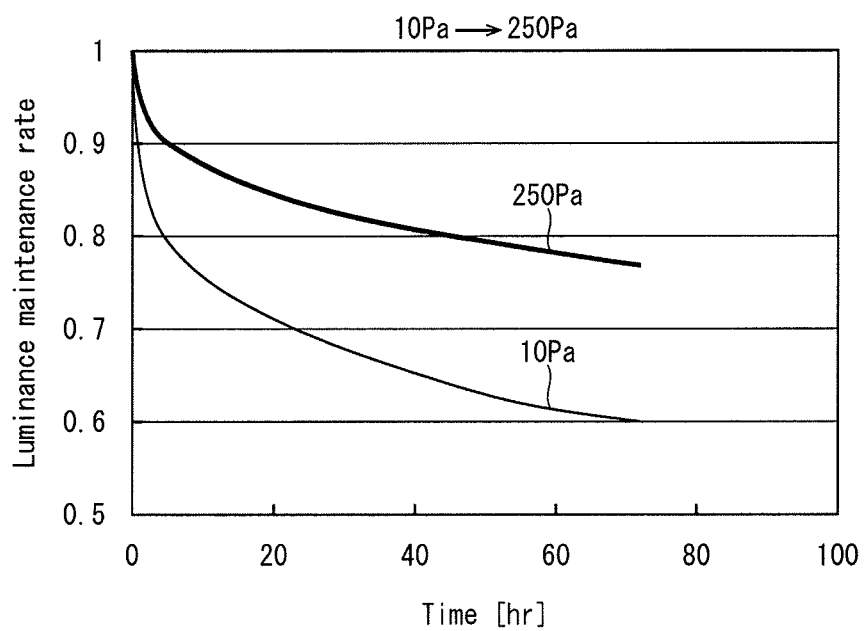
FIGS. 10A and 10B are figures indicating the luminance maintenance rates of organic EL elements observed when they were driven by a constant current, the organic EL elements having been manufactured by varying the amount of introduced/exhaust gas.
Figure 10B:
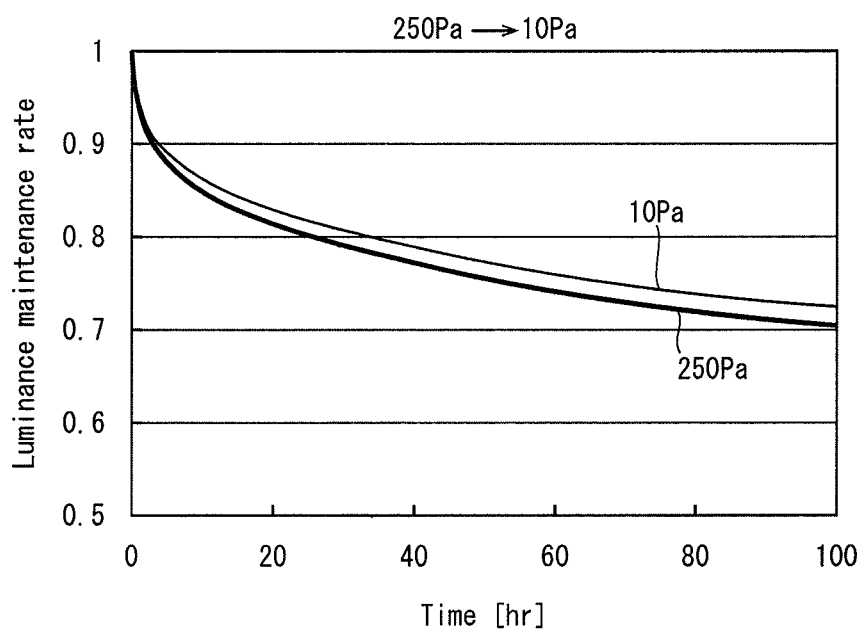

FIGS. 10A and 10B are diagrams indicating the luminance maintenance rates of organic EL elements observed when they were driven by a predetermined current. The organic EL elements were manufactured by varying the amount of introduced/exhaust gas. The initial luminance in this experiment was constant.

Some organic EL elements were manufactured by drying the organic light-emitting material applied film under internal pressure of 10 Pa, and other organic EL elements were manufactured by drying the organic light-emitting material applied film under internal pressure of 250 Pa. These organic EL elements were dried in different orders. Note that the same vacuum chamber 2 was used for drying.

More specifically, in the case of the organic EL elements illustrated in FIG. 10A, one organic EL element was manufactured by being dried under 10 Pa of internal pressure, and then the other organic EL element was manufactured by being dried under 250 Pa of internal pressure.

In contrast, in the case of the organic EL elements illustrated in FIG. 10B, one organic EL element was manufactured by being dried under 250 Pa of internal pressure, and then the other organic EL element was manufactured by being dried under 10 Pa of internal pressure.

First, FIGS. 10A and 10B indicate that the organic EL elements manufactured by being dried under 250 Pa of internal pressure have substantially the same luminance maintenance rates relative to the organic EL elements manufactured by being dried under 10 Pa of internal pressure, regardless of the drying order.

On the other hand, FIGS. 10A and 10B indicate that the organic EL elements manufactured by being dried under 10 Pa of internal pressure have different luminance maintenance rates relative to the organic EL elements manufactured by being dried under 250 Pa of internal pressure, depending on the drying order. More specifically, the organic EL element dried under 10 Pa of internal pressure before 250 Pa of internal pressure (the organic EL element of FIG. 10A) has a worse (lower) luminance maintenance rate than that of the organic EL element dried under 10 Pa of internal pressure after 250 Pa of internal pressure (the organic EL element of FIG. 10B).

It is also to be noted that 10 Pa and 250 Pa of internal pressures cause different amounts of inert gas (nitrogen gas) to flow. These suggest the following.

In the case of the organic EL element dried under 10 Pa of internal pressure before 250 Pa of internal pressure, it is considered that the amount of inert gas (nitrogen gas) flow was not enough in amount to discharge impurities from the vacuum chamber 2, causing the impurities to adhere to the organic light-emitting material applied film and decreasing the luminance maintenance rate.

On the other hand, in the case of the organic EL element dried under 10 Pa of internal pressure after 250 Pa of internal pressure, it is considered that impurities were discharged from the vacuum chamber 2 when the organic light-emitting material applied film was dried under 250 Pa of internal pressure, and impurities hardly existed in the vacuum chamber 2 when the organic light-emitting material applied film was dried under 10 Pa of internal pressure.

(2) Discharge Rate

The inventor found that it is possible to discharge (flow out) the impurities from the vacuum chamber 2 by introducing and discharging a gas into/from the vacuum chamber 2 to create a gas (air) flow in the vacuum chamber 2.

An experiment result indicates that 250 Pa of internal pressure of the vacuum chamber 2 provides the effect of discharging impurities. When the internal pressure of the vacuum chamber 2 is 250 Pa, the discharge rate of nitrogen molecules per unit volume is $3.3 \times 10^{-5}$ mol/(s·L). Note that "L" denoting the unit volume is "liter".

The following explains how to calculate the discharge rate.

Let "P" denote the pressure (Pa), "n" denote the number of molecules (mol), "V" denote the volume (L), "T" denote the temperature (K), "R" denote the gas constant ($8.314 \times 10^3$ J/(K·mol), then the following equation is obtained from ideal gas law:

$$PV = nRT \quad \text{Equation (1)}$$

Note that the volume inside the vacuum chamber 2 is constant, and thus the volume V is constant. It is also assumed that the temperature T in the vacuum chamber 2 is controlled to be constant. On the other hand, the pressure P and the number of molecules "n" in the vacuum chamber 2 vary with time. Here, let $\Delta P$ denote the variation of pressure per unit time, and $\Delta n$ denote the variation of the number of molecules per unit time, then the following equation is obtained:

$$\Delta P \cdot V = \Delta n \cdot R \cdot T$$

$$\Delta n = \Delta P \cdot V / (R \cdot T) \quad \text{Equation (2)}$$

Figure 11:
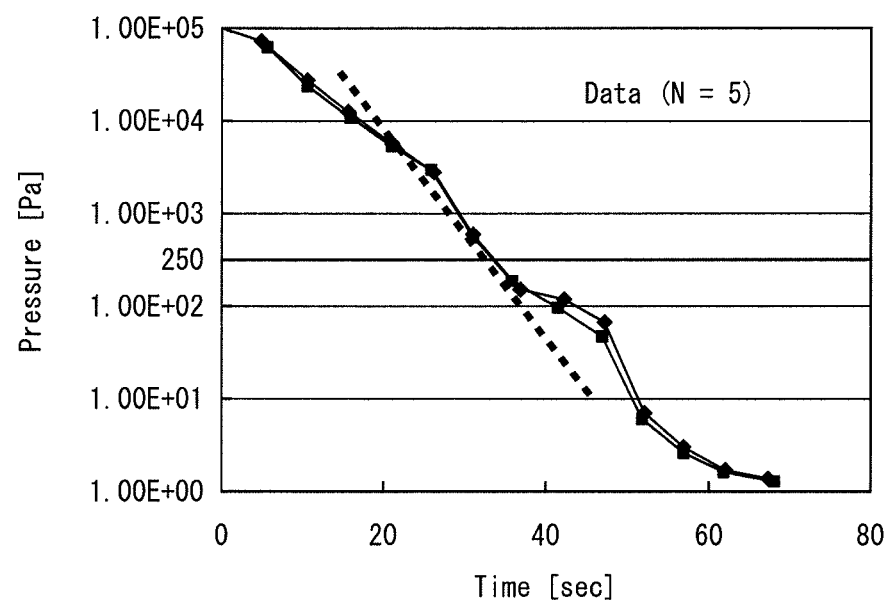
FIG. 11 is a diagram illustrating the relationship between the time and the internal pressure of the vacuum chamber.

FIG. 11 is a diagram illustrating the relationship between the time and the internal pressure of the vacuum chamber, and the dotted line in this figure represents a slant for the case where the internal pressure is set to 250 Pa.

The experiment was conducted with 250 Pa of the internal pressure, and thus the slant of the dotted line represents the variation of pressure per unit time, namely $\Delta P$, for the case where the internal pressure is set to 250 Pa. The variation $\Delta P$ of pressure per unit time for the case where the internal pressure is set to 250 Pa is 85 Pa/s, from FIG. 11. Furthermore, the volume of the vacuum chamber 2 is 77 L, and the temperature inside the vacuum chamber 2 is 308K (25° C.). When these values are substituted for Equation (2), the following equation is obtained:

$$\Delta n = 85.77/(8.314 \times 10^3 \cdot 0.308) = 2.5 \times 10^{-3} \text{ mol/s}$$

In the above equation, $\Delta n$ represents the decrease in the number of molecules per minimum unit time at which the effect is obtained by the refresh process.

Next, when the volume of the vacuum chamber 2 is taken into consideration, the following equation is obtained:

$$\Delta n/V = 2.5 \times 10^{-3}/77 = 3.3 \times 10^{-5} \text{ mol/(s·L)}$$

In the above equation, $\Delta n/V$ represents the decrease in the number of molecules (the discharge rate of gas molecules) per unit time per minimum unit volume with which the effect is obtained by the refresh process.

On the other hand, the decrease in the number of molecules per unit time becomes the upper limit when the internal pressure of the vacuum chamber 2 is set to the atmospheric pressure, namely when the pump has the maximum exhaust speed.

Figure 12:
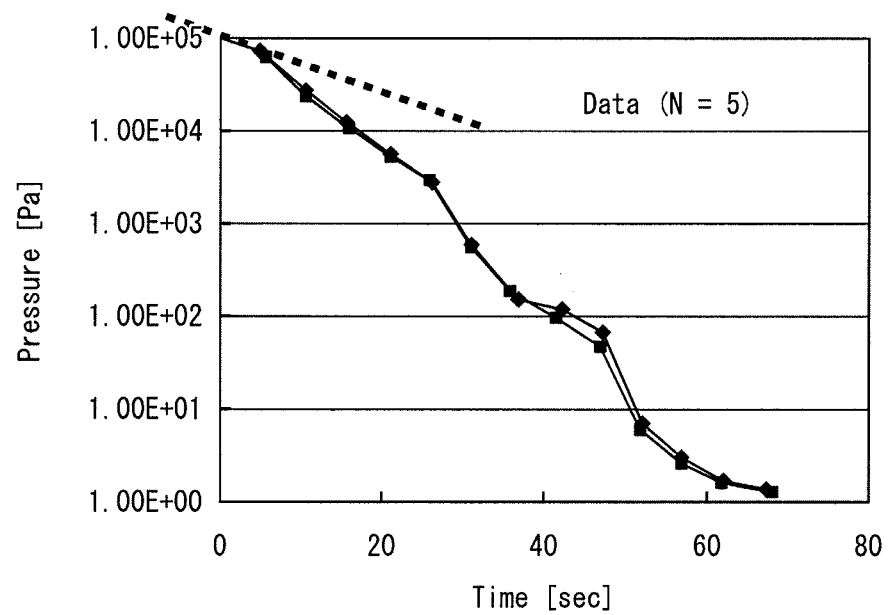
FIG. 12 is a diagram illustrating the relationship between the time and the internal pressure of the vacuum chamber.

FIG. 12 is a diagram illustrating the relationship between the time and the internal pressure of the vacuum chamber, and the dotted line in this figure represents a slant for the case where the internal pressure is set to 101 kPa, namely the atmospheric pressure.

The slant of the dotted line in the drawing represents the variation of pressure per unit time, namely $\Delta P$, for the case where the internal pressure is set to 101 kPa. The variation $\Delta P$ of pressure per unit time for the case where the internal pressure is set to 101 kPa is 7000 Pa/s, from FIG. 12. Furthermore, the volume of the vacuum chamber 2 is 77 L, and the temperature inside the vacuum chamber 2 is 308K (25° C.). When these values are substituted for Equation (2), the following equation is obtained:

$$\Delta n = 7000 \cdot 77/(8.314 \times 10^3 \cdot 308) = 2.1 \times 10^{-1} \text{ mol/s}$$

In the above equation, $\Delta n$ represents the decrease in the number of molecules per minimum unit time at which the effect is obtained by the refresh process.

Next, when the volume of the vacuum chamber 2 is taken into consideration, the following equation is obtained:

$$\Delta n/V = 2.1 \times 10^{-3}/77 = 2.7 \times 10^{-3} \text{ mol/(s·L)}$$

In the above equation, $\Delta n/V$ represents the decrease in the number of molecules (the discharge rate of gas molecules) per unit time per maximum unit volume with which the effect is obtained by the refresh process.

Note that, in the case where the internal pressure is set to 10 Pa, the decrease in the number of molecules (the discharge rate of gas molecules) per unit time per unit volume is represented as follows:

$$\Delta n/V = 3.5 \times 10^{-6} \text{ mol/(s·L)}$$

This makes it clear that the discharge rate (exhaust amount) of gas molecules when the internal pressure is set to 10 Pa is approximately one tenth of that when the internal pressure is set to 250 Pa. It can be said from this that the discharge rate determines the capability for refreshing the vacuum chamber 2.

4. Preparatory Studies

The inventor had made various studies before reaching the present invention, and the findings acquired through the studies are reflected in the present invention. The following explains results of the studies that the inventor had made before reaching the present invention.

(1) Difference in Light-Emitting Characteristics by Presence/Absence of Vacuum Procedure The inventor verified whether or not performing a vacuum procedure after the formation of the organic light-emitting material applied film makes any difference to the light-emitting characteristics of the organic EL element. As the samples for the experiment, two types of organic EL elements were prepared: an organic EL element in which the vacuum procedure had not been performed (hereinafter referred to as "organic EL element without the vacuum procedure"); and an organic EL element in which the vacuum procedure had been performed (hereinafter referred to as "organic EL element with the vacuum procedure").

(1-1) Preparation of Organic EL Elements

The organic EL element without the vacuum procedure was formed as follows. First, according to the above-described manufacturing method, anodes, a hole injection layer and a hole transport layer were laminated in the stated order on a substrate. Next, an organic light-emitting material applied film was formed on the upper surface of the hole transport layer, and a film of an organic light-emitting layer was formed by heating and drying the organic light-emitting material applied film. Subsequently, the substrate on which the film of the organic light-emitting layer had been formed was laid in a glove box for 20 minutes. After this, the organic EL element without the vacuum procedure was completed by laminating an electron transport layer, a cathode and a sealing layer in the stated order on the organic light-emitting layer.

The organic EL element with the vacuum procedure was formed as follows. First, as is the case with the organic EL element without the vacuum procedure, anodes, a hole injection layer, a hole transport layer and an organic light-emitting layer were laminated in the stated order on a substrate. Next, the substrate on which the film of the organic light-emitting layer had been formed was laid in a vacuum chamber that was connected to a vacuum pump. Subsequently, the vacuum pump was activated to put the vacuum chamber 2 into the vacuum state, and the substrate on which the film of the organic light-emitting layer had been formed was left in this state for 20 minutes. After this, the organic EL element with the vacuum procedure was completed by laminating an electron transport layer, a cathode and a sealing layer in the stated order on the organic light-emitting layer.

Figure 13:
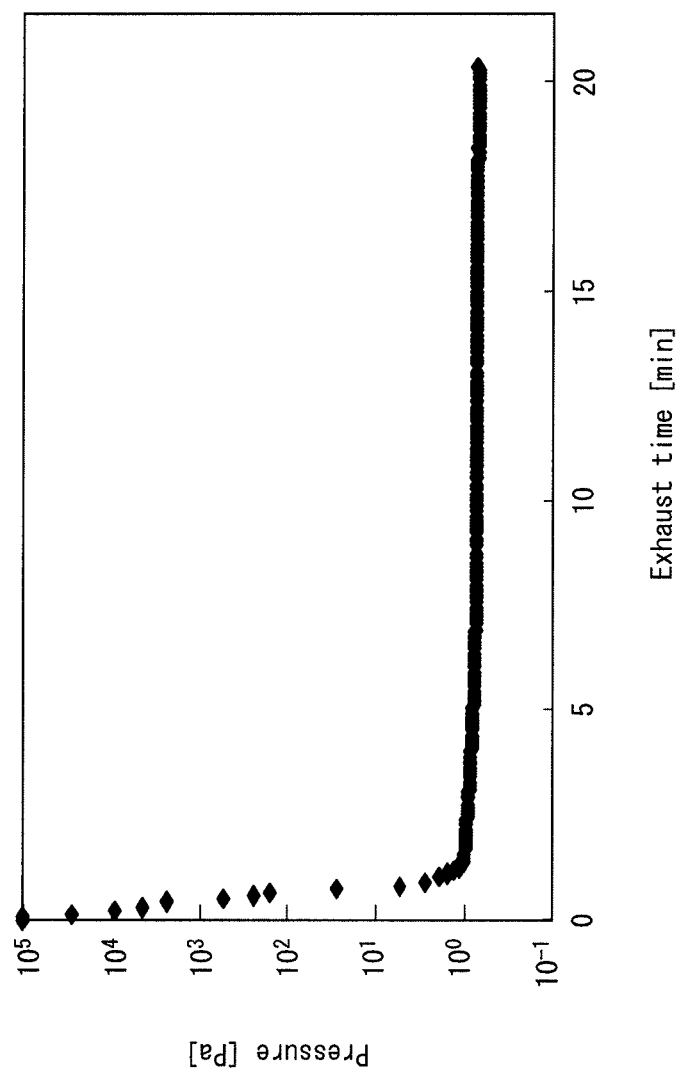
FIG. 13 is a graph indicating the relationship between the internal pressure of the vacuum chamber and exhaust time of a mechanical booster pump that was used in the experiment.

FIG. 13 is a graph indicating the relationship between the internal pressure of the vacuum chamber and exhaust time of a dry pump and a mechanical booster pump that were used in the experiment. The experiment was conducted by using the pumps that have an exhaust profile as illustrated in FIG. 13. The horizontal axis represents the exhaust time by the vacuum pumps, and the vertical axis represents the internal pressure of the vacuum chamber.

In both the organic EL elements without and with the vacuum procedure, known materials were used for the anodes, hole injection layer, hole transport layer, electron transport layer, cathode, and sealing layer. F8-F6 was used as the material of the organic light-emitting layer.

Note that, of course, when the organic EL element without the vacuum procedure is manufactured, the vacuum procedure for drying the organic light-emitting material applied film cannot be performed. As a result, xylene, which is a low boiling point solvent, was used as a solvent for solving the material constituting the organic light-emitting layer in order to form the layer without the vacuum procedure. However, when xylene is used as the solvent, application by the ink jet method is not available. For this reason, when manufacturing the organic EL element for the experiment, the organic light-emitting material applied film was dried by heating. Furthermore, for the sake of comparison between the organic light-emitting layers of the experiment, the drying by heating was also performed on the organic EL element with the vacuum procedure.

(1-2) Light-Emitting Characteristics

Figure 14:
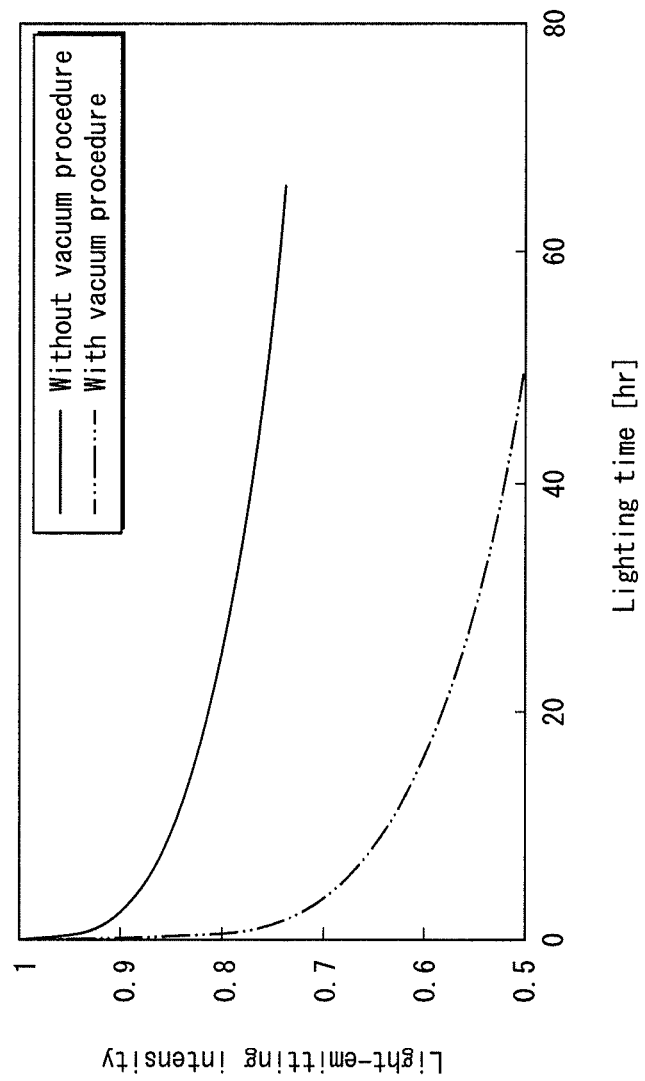
FIG. 14 is a figure illustrating the light-emitting characteristics of the organic EL elements without and with the vacuum procedure.

FIG. 14 is a diagram illustrating the light-emitting characteristics of the organic EL elements without and with the vacuum procedure.

FIG. 14 is a graph indicating the relationship between the lighting time and the light-emitting intensity in the lighting of the organic EL elements of the experiment, the horizontal axis representing the lighting time (hours), and the vertical axis representing the light-emitting intensity. The light-emitting intensity is represented by a relative value, with the light-emitting intensity immediately after a driving start being represented as "1". In FIG. 14, the solid line represents the light-emitting characteristics of the organic EL element without the vacuum procedure ("Without vacuum procedure" in FIG. 14), and the two-dot chain line represents the light-emitting characteristics of the organic EL element with the vacuum procedure ("With vacuum procedure" in FIG. 14).

It is understood that, compared with the organic EL element without the vacuum procedure, the organic EL element with the vacuum procedure greatly reduces the light-emitting intensity with time. In other words, the organic EL element with the vacuum procedure after the formation of the organic light-emitting material applied film has a shorter life until the light-emitting intensity reduces to half (the time required for the light-emitting intensity to reduce to half), than the organic EL element without the vacuum procedure.

The two organic EL elements of the experiment differ only in the environment in which the substrate is placed after the formation of the organic light-emitting layer. That is to say, the great difference in the life until the light-emitting intensity reduces to half was created due to whether the substrate is laid in the glove box or in the vacuum chamber which is connected to a vacuum pump.

(1-3) Considerations

The inventor, from the results illustrated in FIG. 14, considered that the organic light-emitting layer might have been negatively affected by impurities, which were most likely components of the lubricant used in the mechanical vacuum pump and components of the vacuum sealing material or the like, or components of the vacuum sealing material or the like used in the communication passages outside the vacuum chamber connecting the vacuum chamber with the vacuum pump. In the following, "components of the lubricant used in the mechanical vacuum pump and components of the vacuum sealing material or the like" are merely referred to as "components of the lubricant or the like".

In the organic EL element with the vacuum procedure for the experiment, the electron transport layer had been formed by the vacuum film-forming method. Judging from the fact that the light-emitting characteristics were negatively affected even after the vacuum film-forming procedure, the impurities were assumed to have a relatively high boiling point and not to evaporate even under a high degree of vacuum during the vacuum film forming. This led the inventor to consider that the impurities were most likely the components of the lubricant or the like.

The lubricant generally includes a lubricating component (for example, a lubricating oil), and an antioxidant for preventing the lubricating component from oxidizing. Furthermore, the vacuum sealing material also contains an antioxidant for the purpose of preventing the resin material constituting the vacuum sealing material from oxidizing. Antioxidants are used to prevent so-called sludge and varnish from being generated due to the oxidation of the lubricating component or resin material. Known types of antixoxidants include, for example, a chain stopping agent, a peroxide-decomposing agent, and a metal inactivating agent.

Among these, the inventor paid attention to the chain stopping agent that is composed of a diphenylamine-derivative, a phenolic compound and the like, and stops the progress of oxidation of the lubricating component. In general, radicals are unstable. However, in the case of a radical that is formed when a diphenylamine-derivative or a phenolic compound loses a hydrogen atom, the radical is considered to be relatively stable because a resonance stabilization occurs due to an aromatic ring adjacent to the radical portion. For this reason, such compounds react to be radicals themselves by supplying hydrogen atoms to the radical species and the highly reactive peroxides that are generated by oxidation. Since the radicals of the diphenylamine-derivative and the phenolic compound are relatively stable, it is possible to stop the chain reaction. Due to this property, the diphenylamine-derivative and the phenolic compound are used as chain stopping agents for stopping the progress of oxidation.

(2) Mechanism of the Decrease in the Time Until the Light-Emitting Intensity is Reduced by Half In the following, the case of the diphenylamine-derivative is mainly explained as one example.

Figure 15:
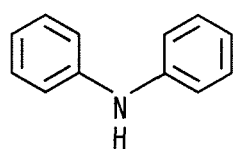
FIG. 15 (a)-(d) is a diagram illustrating examples of dephenylamine and its derivatives used as antioxidants.
Figure 15:
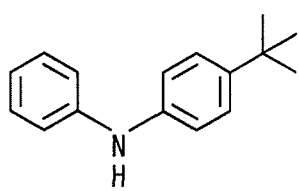
Figure 15:
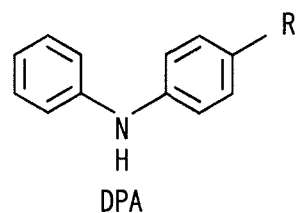
Figure 15:
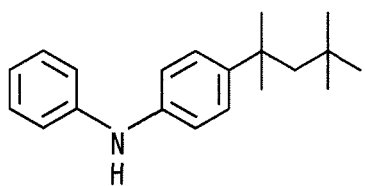

FIG. 15 is a diagram illustrating examples of dephenylamine and its derivatives used as antioxidants. Portions (a), (b) and (c) of FIG. 15 illustrate respective chemical formulas of compounds A, B and C as examples of dephenylamine and its derivatives. In subsequent drawings, the compounds A, B and C as examples of dephenylamine and its derivatives are generically represented by the chemical formula illustrated in the portion (d) of FIG. 15. It should also be noted that the diphenylamine-derivative is denoted as "DPA".

Figure 16:
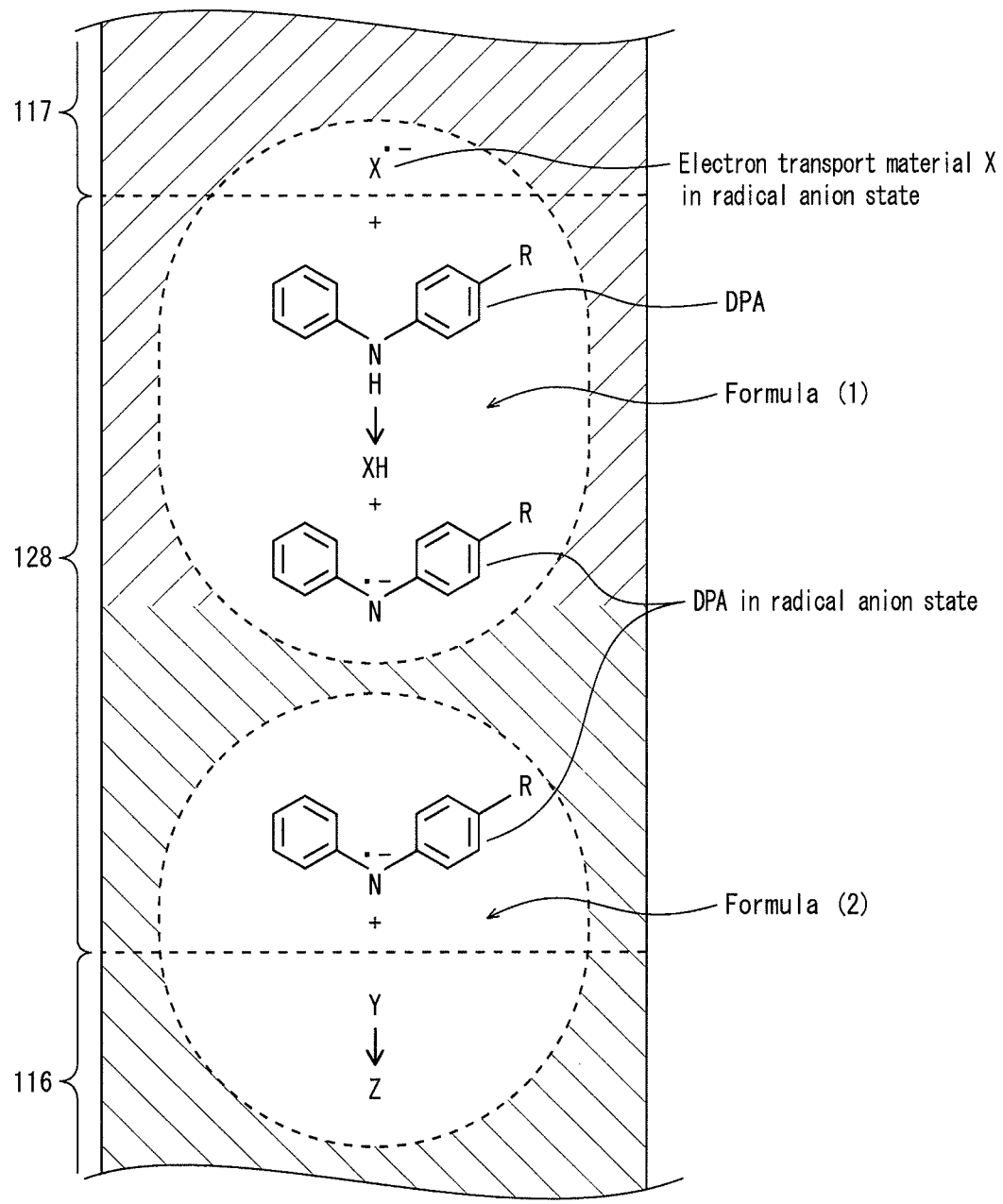
FIG. 16 is a diagram for explaining an example mechanism by which dephenylamine and its derivatives decrease the time until the light-emitting intensity is reduced by half.

FIG. 16 is a diagram for explaining an example mechanism by which dephenylamine and its derivatives decreases the time until the light-emitting intensity is reduced by half. In the drawing, an interface region 128 between the organic light-emitting layers 116 and the electron transport layer 117 is illustrated by exaggeration for the sake of explanation.

First, as indicated by formula (1), when the organic EL element is being driven, an electron transport material X constituting the electron transport layer 117 is in the radical anion (polaron) state ("Electron transport material X in radical anion state" in FIG. 16) for electrons to be transported.

Therefore the electron transport material X in the radical anion state can be considered as a carrier. In the interface region 128, DPAs supply hydrogen atoms to the electron transport material X in the radical anion state so as to be in the radical anion state themselves ("DPA in radical anion state" in FIG. 16).

The inventor considered that the reason for such reaction to occur is that the DPA in the radical anion state can exist in a stable manner due to the delocalization of the negative charges in the two aromatic rings. That is to say, the inventor considered that the DPA in the radical anion state has a more stable structure than the electron transport material X in the radical anion state. Furthermore, the electron transport material X in the radical anion state bonds with hydrogen atoms discharged from the DPA ("XH" in FIG. 16).

As can be explained based on formula (1), it is considered that one of the factors for the organic EL element with the vacuum procedure to greatly reduce the light-emitting intensity is that the electron transport material X in the radical anion state, which is the carrier, is eliminated by the DPA, thereby the amount of electron injected into the organic light-emitting layers 116 is reduced.

Next, as indicated by formula (2), it is assumed that, in the interface region 128, the DPA in the radical anion state may react with the material Y that constitutes the organic light-emitting layers 116. This reaction produces a product Z that is different from the material Y that constitutes the organic light-emitting layers 116. This corresponds to the deterioration of the organic light-emitting layers 116. It is considered that such a reaction between the DPA and the material Y that constitutes the organic light-emitting layers 116 is also one of the factors for the light-emitting intensity to be reduced. Furthermore, not limited to the case where the DPA directly reacts with the material Y, the light-emitting intensity may also be reduced via radicals that may be generated by the remaining solvent or water that may be present in a certain stage of the manufacturing process.

Since the above-described mechanism is assumed, the inventor considered that the antioxidant contained in the lubricating agent or the like, in particular the chain stopping agent, has a great influence on the decrease in the time until the light-emitting intensity is reduced by half.

(3) Analysis of Surface of Organic Light-Emitting Layer Having Passed Through Vacuum Procedure Next, materials adsorbed to the surface of the organic light-emitting layer that had passed through the vacuum procedure were analyzed by using a gas chromatograph mass spectrometer (GC-MS). The organic light-emitting layer having passed through the vacuum procedure was heated in a helium atmosphere, and the gas (outgas) discharged from the heated organic light-emitting layer was collected by liquid nitrogen, and the collected gas was analyzed by the GC-MS. For the GC-MS analysis, 6890GC made by Agilent Technologies Inc. was used, and the ionization was performed by the EI (Electron Ionization) method. For the column, DB-5mn made by Agilent Technologies Inc. was used, and the column was heated from 40° C. to 300° C.

Figure 17:
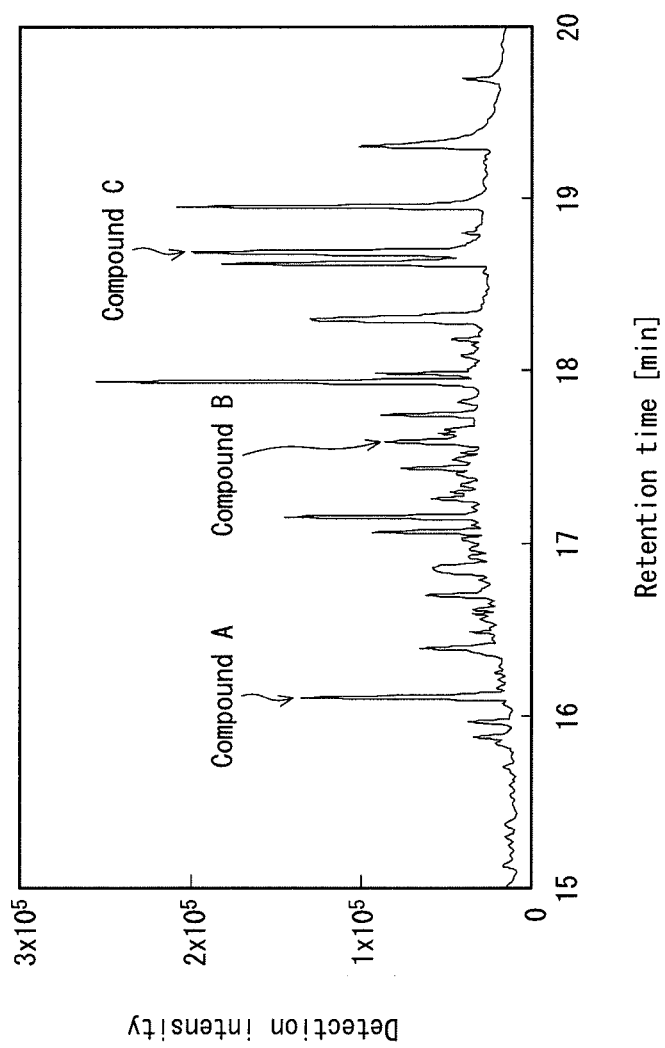
FIG. 17 is a diagram illustrating the results of the analysis of the surface of the organic light-emitting layer having passed through the vacuum procedure.

FIG. 17 is a diagram illustrating the results of the analysis of the surface of the organic light-emitting layer having passed through the vacuum procedure. The vertical axis represents the detection intensity (that is the "total ion current" and corresponds to the number of detected molecules), and the horizontal axis represents the retention time (minutes). FIG. 17 illustrates a gas chromatograph for a range between 15 minutes and 20 minutes of retention time. Peaks of the compounds A, B and C were detected at approximately 16 minutes to 19 minutes of retention time. The GC-MS analysis was also conducted on each of the compounds A, B and C and it was confirmed that the retention times and mass spectra thereof match the results illustrated in FIG. 17.

From the results of the GC-MS analysis, the inventor found out that the decrease in the time until the light-emitting intensity is reduced by half is caused by the diphenylamine-derivative that is contained, as an antioxidant, in the lubricating agent or the like used in the vacuum pump. The inventor further assumed that the diphenylamine-derivative may fly from the vacuum pump into the vacuum chamber by the mechanism explained in the next section.

Figure 18:
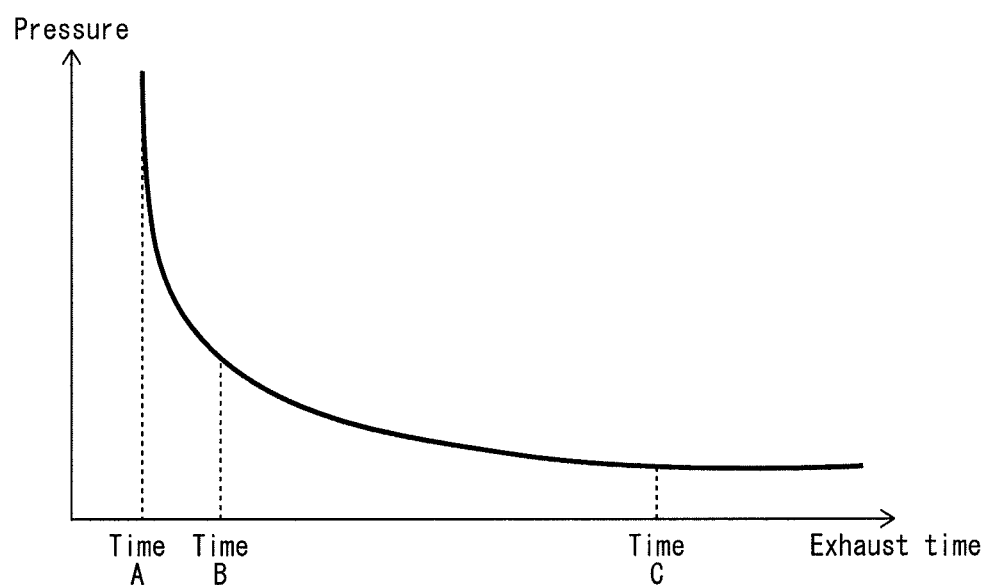
FIG. 18 is a graph illustrating the relationship between the exhaust time by the vacuum pump and the internal pressure of the vacuum chamber.

(4) Mechanism for Impurities to Fly from Vacuum Pump into Vacuum Chamber (4-1) Mechanism FIG. 18 is a graph illustrating the relationship between the exhaust time by the vacuum pump and the internal pressure of the vacuum chamber 2. The horizontal axis represents the exhaust time and the vertical axis represents the internal pressure of the vacuum chamber 2. Note that in the vertical axis, a lower position indicates a higher degree of vacuum.

The time A corresponds to the time at which the vacuum pump 3 is activated. The time B corresponds to the time at which the reduction of the internal pressure of the vacuum chamber 2 is in progress. At time C, the internal pressure of the vacuum chamber 2 has been reduced to the ultimate vacuum of the vacuum pump 3 and has reached the equilibrium state. The following explains the situations inside the vacuum chamber 2 and the vacuum pump 3 at times A, B and C with reference to FIGS. 19A, 19B and 19C.

Figure 19A:
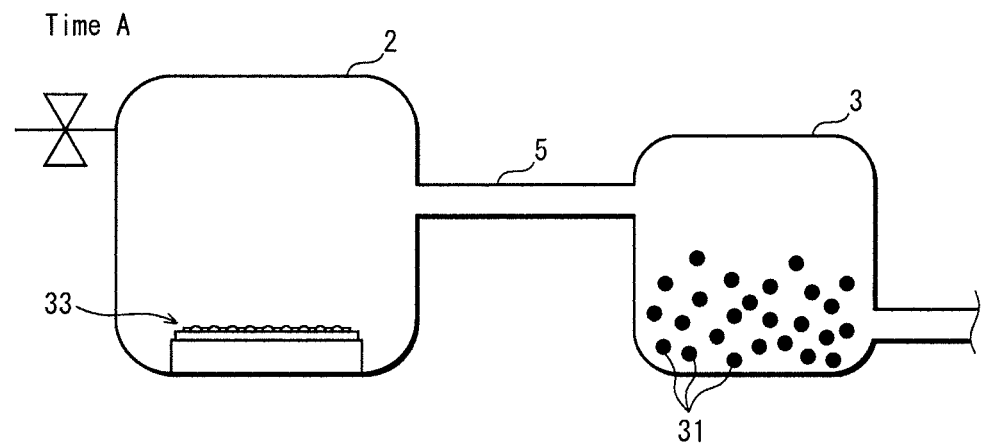
FIGS. 19A, 19B and 19C are diagrams schematically illustrating the situations inside the vacuum chamber and the roughing vacuum pump at times A, B and C, respectively.
Figure 19B:
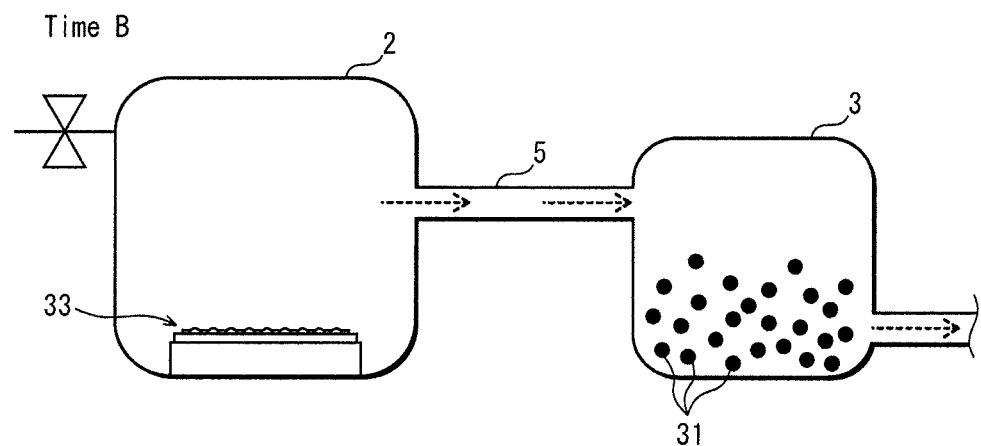
Figure 19C:
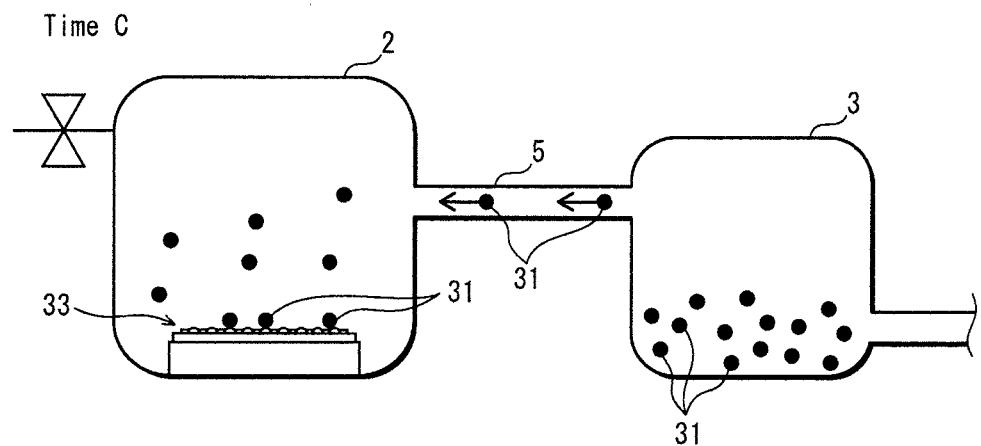

FIGS. 19A, 19B and 19C are diagrams schematically illustrating the situations inside the vacuum chamber 2 and the vacuum pump 3 at times A, B and C indicated in the graph of FIG. 18, respectively.

As illustrated in FIGS. 19A to 19C, the vacuum chamber 2 is connected to the vacuum pump 3 via the exhaust pipe 5. The gas in the vacuum chamber 2 is discharged to outside by the vacuum pump 3 via the exhaust pipe 5. In each of FIGS. 19A to 19C, the sign "31" represents impurities, namely the antioxidant (the chain stopping agent) contained in the lubricating agent or the like used in the vacuum pump 3.

FIG. 19A illustrates the situation at the time of the activation of the vacuum pump 3. When the pressure reduction is started, as indicated by the dotted-line arrow in FIG. 19B, the gas in the vacuum chamber 2 flows through the exhaust pipe 5 and the vacuum pump 3 and is discharged to outside therefrom. In this way, an air flow, flowing from the vacuum chamber 2 to the exhaust pipe 5 and then to the vacuum pump 3, is generated. For this reason, it is considered that no impurities 31 fly into the vacuum chamber 2 during the pressure reducing period (at time B).

However, at time C, the internal pressure of the vacuum chamber 2 has been reduced to the ultimate vacuum of the vacuum pump 3. Thus the air flow between the vacuum chamber 2 and the vacuum pump 3 is in the equilibrium state. Furthermore, as the degree of vacuum in the vacuum chamber 2 increases, the ratio of the vapor pressure of the impurities 31 to the internal pressure of the vacuum chamber 2 increases. From these, the inventor considered that, as illustrated in FIG. 19C, at time C, the impurities 31 may fly from the vacuum pump 3 into the vacuum chamber 2, and the impurities 31 may adhere to the intermediate product 33 of the organic EL element after the organic light-emitting layer has been formed. The inventor also considered that, as the degree of vacuum in the vacuum chamber 2 increases, the mean free path of the impurities 31 becomes longer and the probability of collision between the organic light-emitting layer and the impurities 31 becomes higher.

According to the present embodiment, the vacuum chamber 2 can be refreshed even if it is in the state at time C. Furthermore, according to the refresh method of the present embodiment, even the impurities in the exhaust pipe 5 can be removed. In this reagard, it was confirmed that a contamination does not occur when the vacuum procedure is performed and the internal pressure is reduced to an approximate range from 0.6 Pa to 10 Pa, on the condition that the vacuum procedure is performed for less than 20 minutes after the refresh procedure. On the other hand, a contamination would occur if the pressure reduction is performed without the refresh procedure under the same condition. As a result, the present embodiment can be applied to, for example, a pressure reduction performed for less than 20 minutes (for the purpose of drying or the like), or a roughing procedure for pressure reduction performed for a short time period, as necessary.

(4-2) Considerations

As described above, the inventor found that the impurities 31 fly from the vacuum pump 3 into the vacuum chamber 2 at time C as illustrated in FIG. 19C. In other words, even if the vacuum pump 3 is used, the flying of the impurities 31 into the vacuum chamber 2 does not occur until time C. Note that the internal pressure of the vacuum chamber 2 at time C is 15 Pa.

Also, if the internal pressure of the vacuum chamber 2 is higher than 15 Pa, it is possible to obtain a high degree of vacuum, with no flying of the impurities 31 into the vacuum chamber 2. That is to say, the contamination of inside of the vacuum chamber 2 can be prevented if, after the refresh process, the internal pressure of the vacuum chamber 2 used is higher than 15 Pa.

5. Summary (1) Refresh Process (1-1) Exhaust Amount of Gas

The refresh process is aimed to discharge impurities from inside of the vacuum chamber. To discharge the impurities, mainly the ventilation (air flow) in the vacuum chamber is used, and as a result of intense study, the inventor found out that it is possible to discharge (flow out) the impurities if the exhaust amount of gas from the vacuum chamber (the decrease in the number of molecules per unit time per unit volume) is at least $3.3 \times 10^{-5}$ mol/(s·L).

In the experiment, the drying procedure was performed after the organic light-emitting material applied film (116a) of the organic EL element was formed. However, in general, manufacturing a product by using a vacuum chamber in which impurities remain is not preferable. Thus from the viewpoint of removing the impurities, the refresh process is effective even in the manufacturing process of a product other than the organic light-emitting panel if the process includes a procedure in which a vacuum pump is used. In particular, the refresh process is effective in removing impurities that may deteriorate the property of the product, as described in Embodiment 2.

The gas to be used in the refresh process may not necessarily be an inert gas depending on the product to be manufactured, but may be another gas (for example, the air). However, an inert gas is preferable when impurities contained in the air and the reaction between that gas and the application film are taken into consideration.

(1-2) Temperature in Chamber

In the refresh process, the air flow is used to remove impurities from inside of the vacuum chamber 2. The removal of the impurities is defined by a predetermined amount of air flow, namely, the amount of exhaust gas.

In Embodiment 1, the set values P1 and P2 for the internal pressure Pc of the vacuum chamber 2 in the refresh process (step S7 in FIG. 3) are assumed to be 250 Pa and 101 kPa, respectively. This is because, since the vacuum apparatus 1 does not have the function to control the amount of exhaust gas, it is defined by the internal pressure of the vacuum chamber 2, and the internal pressure is affected by the temperature.

The above-mentioned set values of the internal pressures in Embodiment 1 correspond to the case where the temperature in the vacuum chamber 2 is set to 35° C. Accordingly, when the temperature in the vacuum chamber 2 is other than 35° C., the set values P1 and P2 need to be changed from the above-mentioned values. In that change, the set values P1 and P2 may be changed in accordance with the Boyle-Charles's Law based on the temperature setting in the vacuum chamber 2. Alternatively, settings may be made such that the controller 20 automatically calculates the set values P1 and P2 on the presumption that the volume is constant.

(1-3) Retained Effect of Refresh Process

The amount of impurities that remain in the vacuum chamber 2 immediately after the refresh process mentioned in Embodiment 1 is considered to be small. On the other hand, to improve the quality of the organic light-emitting layer, it is preferable to form the organic light-emitting layer under a high degree of vacuum, but it causes the backflow diffusion of impurities from the vacuum pump to occur.

It was confirmed that, immediately after the refresh process of Embodiment 1, even when the pressure is reduced to the ultimate vacuum of the vacuum pump, the inside of the vacuum chamber 2 is not contaminated with impurities for at most 20 minutes.

Accordingly, in the case where it takes 20 minutes to form one organic functional film, under a high degree of vacuum, it is possible to form one organic functional film with a small amount of impurities adsorbed thereto, with the refresh process.

Also, in the case where it takes 10 minutes to form one organic light-emitting layer, it is possible to form two organic light-emitting layers consecutively with a small amount of impurities adsorbed thereto, with the refresh process.

Conversely, in the case where it takes more than 20 minutes to form one organic functional film, the refresh process may be performed twice or more during the formation of one organic functional film.

(2) Manufacturing Method (2-1) Case where Refresh Process and Drying Process Belong to Different Systems In the manufacturing method of the organic EL element (organic EL display panel), when the drying program of Embodiment 1 is employed and the vacuum pump is used to dry the formed (applied) organic light-emitting material applied film, the refresh process is performed, and then the substrate 111 with the organic light-emitting material applied film 116a formed thereon is placed in the vacuum chamber 2, and gas is discharged from inside of the vacuum chamber 2.

It should be noted here however that it is possible to restrict impurities from flying into the vacuum chamber by, after refreshing it once, maintaining the internal pressure of the vacuum chamber at higher than 15 Pa during the drying of the organic light-emitting material applied film.

Accordingly, the organic light-emitting material applied film 116a may be dried by repeating several times the process of performing steps S31 and S35 in succession without the refresh process of step S32 illustrated in FIG. 5, and then the drying program illustrated in FIG. 5 or the program for the refresh process illustrated in FIG. 3 may be executed.

(2-2) Case where Refresh Process and Drying Process Belong to Same System

According to the drying program illustrated in FIG. 5, after the refresh process, the substrate with the organic light-emitting material applied film formed thereon is placed in the vacuum chamber and then the drying process is performed. It should be noted here however that it is possible to perform the refresh process and the drying process in the same procedure (at the same time) as far as the processes are performed under a pressure that is higher than the pressure set for the refresh process (250 Pa in the case of the embodiments of the present invention).

Figure 20:
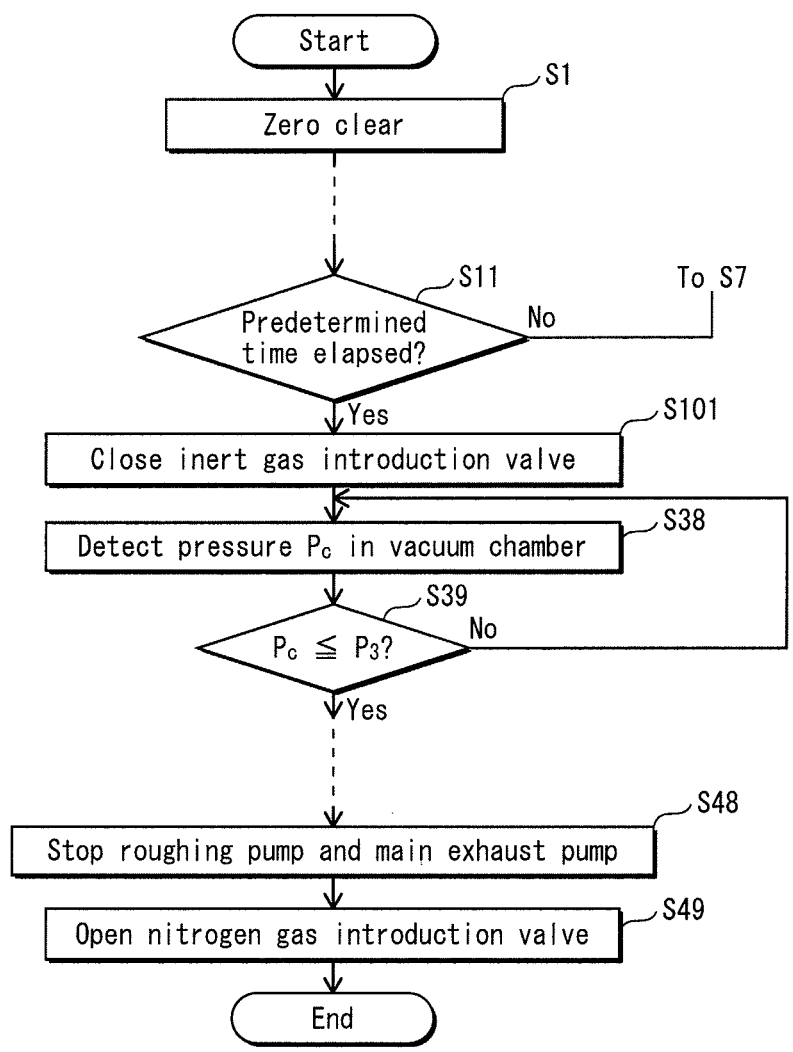
FIG. 20 is a flowchart of the case where the refresh process and the drying process are performed in the same system.

FIG. 20 is a flowchart of the case where the refresh process and the drying process are performed in the same system.

This program is started when the controller 20 receives an input operation by the operator for activating the program after a substrate with the organic light-emitting material applied film applied thereon (an intermediate product) is placed in the vacuum chamber 2.

As is the case with the refresh process of Embodiment 1, after the start, the controller 20 performs a zero clear (S1), and then performs steps S2 to S10 as illustrated in FIG. 3. When it is judged that the count value has exceeded the predetermined value representing the predetermined time period ("YES" in S11), the refresh process is completed.

After this, the inert gas introduction valve 12 is closed (S101). This causes the roughing vacuum pump 3 to discharge gas from the vacuum chamber 2, reducing the internal pressure of the vacuum chamber 2.

Subsequently, the pressure Pc in the vacuum chamber 2 is detected (S38), then, as in the drying process of Embodiment 1, it is judged whether or not the pressure Pc≤ the set value P3 (S39), then steps S40 to S49 are performed as illustrated in FIG. 5, and the process ends.

According to this program, by merely performing an operation for starting the program after placing a substrate with the organic light-emitting material applied film applied thereon in the vacuum chamber 2, it is possible to complete the procedure up to drying the organic light-emitting material applied film.

(3) Temperature of Roughing Exhaust Pipe

In the experiment whose results are illustrated in FIGS. 10A and 10B, the temperature in the vacuum chamber 2 is set to be higher than that of the roughing exhaust pipe 5. More specifically, since the drying is performed at the room temperature, the temperature of the roughing exhaust pipe 5 is approximately 25° C. As a result, the experiment was conducted by setting the temperature in the vacuum chamber 2 to 35° C. which is higher than 25° C.

It is considered that when the temperature in the vacuum chamber 2 is higher than that of the roughing exhaust pipe 5, molecular motion of the impurities that exist in the vacuum chamber 2 is activated, and the refresh process can remove the impurities more reliably.

Embodiment 3

Figure 21:
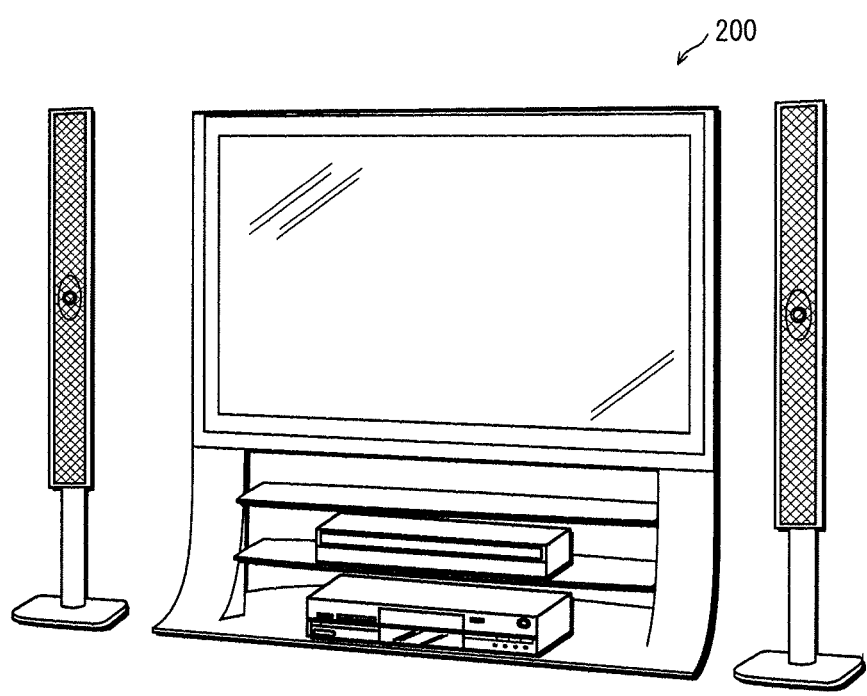
FIG. 21 is a perspective view of an organic EL display apparatus, etc.
Figure 22:
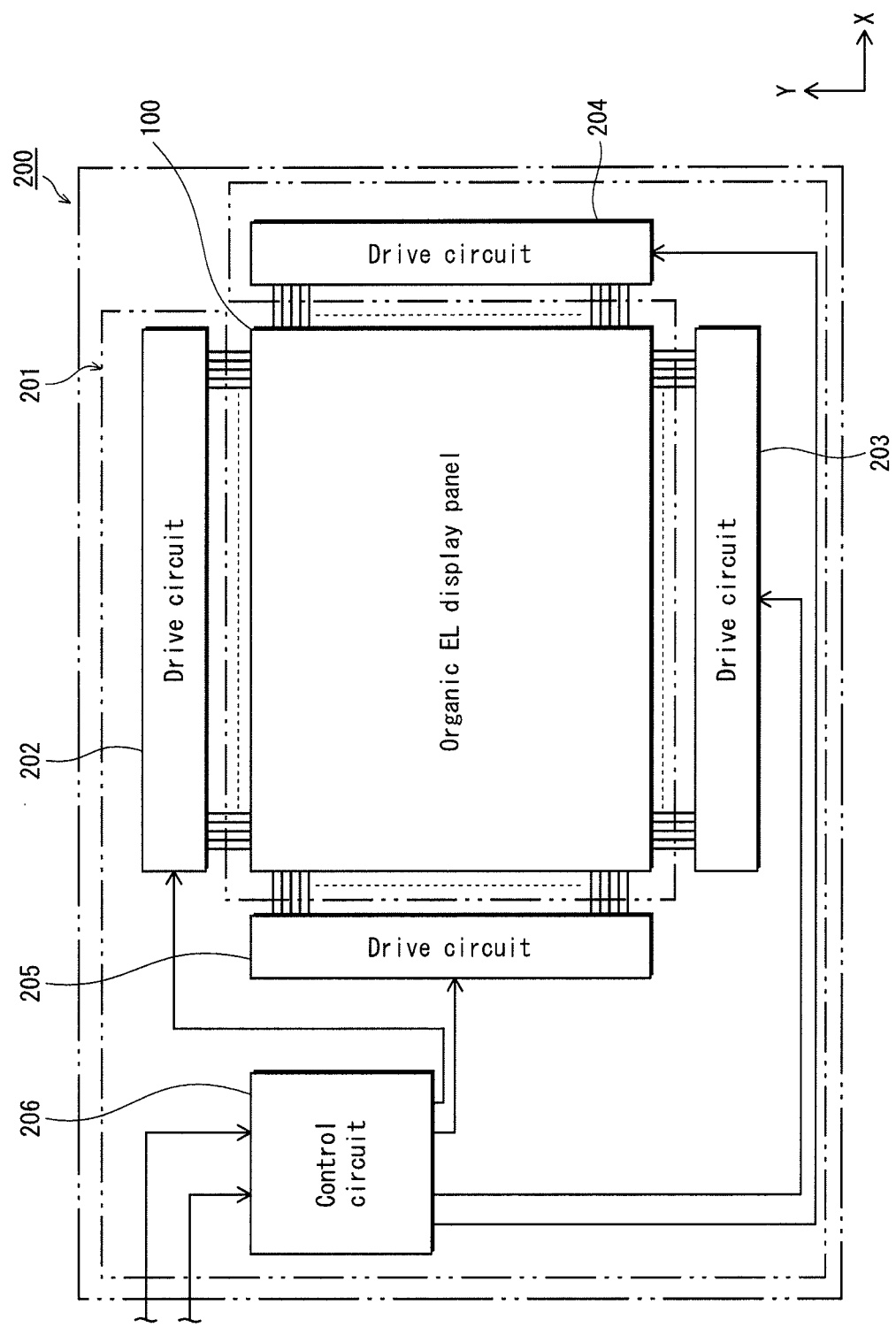
FIG. 22 is a diagram illustrating the entire structure of the organic EL display apparatus.

FIG. 21 is a perspective view of an organic EL display apparatus, etc. FIG. 22 is a diagram illustrating the entire structure of the organic EL display apparatus.

As illustrated in FIG. 22, an organic EL display apparatus 200 includes the organic EL display panel 100 and a drive controller 201 connected thereto. The drive controller 201 is composed of four drive circuits 202-205 and a control circuit 206. Note that in the actual organic EL display apparatus 200, the placement and connection of the drive controller 201 to the organic EL display panel 100 are not limited to those illustrated in FIGS. 21 and 22.

The organic EL element, which constitutes the organic EL display panel 100 included in the organic EL display apparatus 200, includes the organic light-emitting layer that is formed by using the vacuum chamber 2 on which the above-described refresh process has been performed. Thus the organic light emitting layer has excellent light-emitting characteristics, and the organic EL display apparatus 200 has excellent image quality.

Modifications

Up to now, the present invention has been described through the exemplary embodiments. However, the present invention is not limited to the above-described embodiments. For example, the following modifications may be considered.

1. Impurities

In the embodiments described above, the components of the lubricant or the like are taken as one example of the impurities that are considered to adhere to the intermediate product when the vacuum procedure is performed. However, the impurities targeted by the present invention are not limited to such substances. Also, the lubricant is taken as one example of a material from which the impurities may derive. However, the impurities targeted by the present invention are not limited to such substances that derive from the lubricant. For example, there are materials other than the lubricant that are used in the vacuum pump and the like and may be diffused by the backflow diffusion as impurities. That is to say, the present invention is applicable, in general, to a case where impurities adhere to the inner wall of the vacuum chamber when the vacuum procedure is performed by using the vacuum chamber. For example, the impurities may be contained in the materials of the communication passages, which connect the pumps with the vacuum chamber, and the materials of the pumps.

2. Vacuum Apparatus (1) General

The vacuum apparatus of Embodiment 1 illustrated in FIG. 1 is only one example thereof, but the present invention is not limited to this vacuum apparatus. For example, the main exhaust pump may be omitted depending on the degree of vacuum to be reached. As another example, when heating and drying are performed at the same time, a heater may be provided in the vacuum chamber.

(2) Pump

The dry pump may be used when the inside of the vacuum chamber 2 needs to be kept clean. However, it is assumed that the backflow diffusion of impurities into the vacuum chamber 2 would occur even with use of the mechanical booster pump that is generally classified as a dry pump. It is therefore apparent that using the dry pump is not enough to keep the inside of the vacuum chamber 2 clean when the vacuum process is performed by placing an organic film, to which impurities easily adhere, in the vacuum chamber 2. In this regard, it is very meaningful to perform the refresh process of the present invention to remove the impurities from inside of the vacuum chamber 2.

Also, in the embodiments described above, a mechanical booster pump is used as the main exhaust pump. However, not limited to this, any other type of pump may be used as far as it can create a desired degree of vacuum in the vacuum chamber. Even in a case where such another type of pump is used, impurities may exist in the vacuum chamber due to another factor. It is thus meaningful to perform the refresh process of the present invention to keep the inside of the vacuum chamber clean.

(3) Use Examples

In Embodiment 2, the drying procedure for drying the organic light-emitting material applied film is explained as one example of the pressure reduction procedure in which the internal pressure of the vacuum chamber is reduced while the intermediate product is housed in the vacuum chamber. However, the present invention is not limited to this method.

For example, the present invention is applicable to a preservation procedure in which the intermediate product is preserved in a vacuum state during a time period after the organic light-emitting layer is completed and before the next procedure is started.

Similarly, for example, the present invention is applicable not only to a vacuum apparatus that is used for drying the intermediate product, but also to a vacuum apparatus that is used for preserving the intermediate product housed in the vacuum chamber.

More specifically, a dry pump may be used in the roughing procedure or the like in the vacuum apparatus used for the preservation, and if a contamination occurs, any of the impurities removal methods explained in the embodiments may be used to remove the contamination. The present invention is effective in particular to a manufacturing method of an organic EL element that is sensitive to a slight amount of contamination and tends to greatly decrease in performance.

3. Manufacturing Process

According to the embodiments, in the vacuum procedure, the roughing procedure transitions to the main exhaust procedure. The timing for the transition may be determined appropriately depending on the performance of the roughing pump and the main exhaust pump that are actually used. Furthermore, the vacuum procedure may be performed by using one vacuum pump or by using three or more vacuum pumps in turn.

4. Product (1) General

In Embodiment 2, an organic EL display panel is taken as one example of the product. However, the present invention is not limited to this. For example, the present invention is applicable to any product that includes an organic film formed by the solution-deposition-type film forming method, such as an organic TFT or a soler cell. That is to say, the present invention is broadly applicable to forming, on a substrate, an organic film containing an organic material.

(2) Organic Applied Film

In Embodiment 2, the organic functional film is the organic light-emitting layer. However, the present invention is not limited to this. That is to say, among the layers constituting an EL display panel for organic function, every layer that is formed by first forming an application film by the solution-deposition-type film forming method and then putting the formed application film under the reduced pressure can be the target of the present invention.

(3) Organic EL Element, Organic EL Display Panel

In Embodiment 2, the ITO layer, hole injection layer, (hole transport layer), bank, electron transport layer, (electron injection layer), and sealing layer are not indispensable structural elements. The present invention is applicable to organic EL display panels that do not include any of these structural elements. Conversely, the present invention is applicable to organic EL display panels that include other structural elements such as a hole blocking layer.

In the above-described example, the hole injection layer is formed covering the entire region of the upper surface of the substrate. However, the present invention is not limited to this structure. The hole injection layer may be formed only on the ITO layers. Alternatively, the hole injection layer may be formed to cover only the side surfaces and the upper surfaces of the ITO layers.

When the anodes are formed from a silver (Ag)-based material, it is preferable that the ITO layers are formed on the anodes. When the anodes are formed from an aluminum-based material, the anodes may be formed in a single-layer structure without the ITO layers.

In the above-described example, an organic material is used as the bank material. However, not limited to this, an inorganic material may be used. In that case, the bank material layer may be formed by the solution-deposition-type film forming method, as in the case where an organic material is used.

Embodiment 2 describes an organic EL display panel in which a plurality of organic EL elements are integrated on a substrate as sub-pixels. However, not limited to this example, each organic EL element may be used in a singular form. One example of this structure can be found in a lighting apparatus in which the organic EL elements are used in a singular form.

In the above-described example, the organic EL display panel is a full-color display panel based on light emission of colors R, G and B. However, the present invention is not limited to this. The present invention is applicable to an organic EL display panel in which are arranged a plurality of organic EL elements that each emit a single color of light among R, G, B, white and the like. The present invention is also applicable to a monochrome organic EL display panel in which are arranged a plurality of organic EL elements that emit the same single color of light.

Also, in the organic EL display panel described above, a line bank structure is adopted and a plurality of linear banks are formed in stripes to partition the organic light-emitting layer into linear portions. However, the present invention is not limited to this. For example, a so-called pixel bank structure may be adopted, in which the bank is formed in the lattice shape such that it surrounds each of the plurality of sub-pixels.

Embodiment 2 is described by taking as one example a manufacturing method of a top-emission-type organic EL display panel. However, the present invention is not limited to this. For example, the present invention is applicable to a manufacturing method of a so-called bottom-emission-type organic EL display panel in which the display surface is provided on the substrate side. Furthermore, the present invention is applicable to a manufacturing method of an organic EL display panel of a double-sided light-emission type in which both the anodes and the cathode are made of a transparent conductive material, and the light is emitted from both the anode side and the cathode side.

5. Others (1) Organic Light-Emitting Material Applied Film

Embodiment 2 is described on the assumption that the impurities are adsorbed to the organic light-emitting layer formed through the drying procedure. As described above, however, impurities may adhere to the organic light-emitting material applied film that is in the middle of drying. That is to say, the "organic light-emitting material applied film" may indicate an organic light-emitting layer that has been completed as the drying of the organic light-emitting material applied film has been completed, or may indicate an organic light-emitting material applied film that is in the middle of drying.

Also, "preparing a substrate with an organic light-emitting material applied film formed thereon" described in the embodiments includes a case where the manufacturer who perforans the vacuum procedure prepares it him/herself by forming the organic light-emitting material applied film on the substrate, and a case where the manufacturer who performs the vacuum procedure buys, from another manufacturer, the substrate with the organic light-emitting material applied film formed thereon.

(2) Manufacturing Method of Organic EL Display Panel

The manufacturing method of an organic EL display panel described in Embodiment 2 is provided only as an example. However, not limited to this, for example, a layer described in the above as being formed by forming a film by the vacuum film-forming method may be formed by forming a film by the solution-deposition-type film forming method. Conversely, as another example, a layer described in the above as being formed by forming a film by the solutiondeposition-type film forming method may be formed by forming a film by the vacuum film-forming method.

INDUSTRIAL APPLICABILITY

The present invention is suitable for use in manufacturing an organic EL element that may be used in various types of displays for use at home, public facilities or business, also in television apparatuses, mobile electronic apparatuses or the like, and is suitable for use in thin-film forming procedures, etching procedures and the like.

REFERENCE SIGNS LIST 1 vacuum apparatus
2 vacuum chamber
3 roughing pump
4 main exhaust pump
5 roughing exhaust pipe
20 controller
31 impurities
32 air flow

The invention claimed is:

1. A method for removing impurities from inside of a vacuum chamber, the method comprising:
 ventilating inside the vacuum chamber by introducing a gas into the vacuum chamber and discharging the gas from the vacuum chamber, wherein
 in the ventilating,
  a discharge rate at which molecules of the gas per unit volume are discharged is at least $3.3 \times 10^{-5}$ mol/(s·L), and
  a temperature in the vacuum chamber is at least 15° C. and at most 55° C., and
 the vacuum chamber is used in manufacturing of an organic thin-film element.

2. The method according to claim 1, wherein
 the discharging the gas from the vacuum chamber is performed by a pump that reduces an internal pressure of the vacuum chamber.

3. The method according to claim 1, wherein
 the discharge rate at which molecules of the gas per unit volume are discharged is at most $2.7 \times 10^{-3}$ mol/(s·L).

4. The method according to claim 1, wherein
 the gas is an inert gas.

5. The method according to claim 1, wherein
 in the ventilating, an internal pressure of the vacuum chamber is at least 250 Pa and less than an atmospheric pressure.

6. The method according to claim 5, wherein
 the ventilating is performed for at least 20 minutes while the internal pressure of the vacuum chamber is set to a constant value of at least 250 Pa.

7. The method according to claim 1, wherein
 a material containing diphenylamine or derivatives of diphenylamine, which are the impurities, is used in at least one of a pump and a communication passage connecting the pump with the vacuum chamber.

8. The method according to claim 1, wherein
 the temperature in the vacuum chamber is at least 20° C. and at most 35° C.

9. A method for using a vacuum apparatus that includes a vacuum chamber and a pump, the vacuum chamber housing an object, the pump reducing an internal pressure of the vacuum chamber, the method comprising:
 ventilating inside the vacuum chamber by introducing a gas into the vacuum chamber and discharging the gas from the vacuum chamber by causing the pump to reduce the internal pressure of the vacuum chamber, wherein
 in the ventilating,
  a discharge rate at which molecules of the gas per unit volume are discharged is at least $3.3 \times 10^{-5}$ mol/(s·L), and
  a temperature in the vacuum chamber is at least 15° C. and at most 55° C., and
 the vacuum apparatus is used in manufacturing of an organic thin-film element.

10. The method according to claim 9, wherein
 the discharge rate at which molecules of the gas per unit volume are discharged is at most $2.7 \times 10^{-3}$ mol/(s·L).

11. The method according to claim 9, wherein
 the gas is an inert gas.

12. The method according to claim 9, wherein
 in the ventilating, the internal pressure of the vacuum chamber is at least 250 Pa and less than the atmospheric pressure.

13. The method according to claim 9, wherein
 the object is an intermediate product in a manufacturing process of an organic EL display panel that includes a substrate and an organic functional film formed on the substrate, and is in a state where an organic applied film containing a solvent and an organic material for the organic functional film has been applied to the substrate, and
 the organic applied film is dried by causing the pump to reduce the internal pressure of the vacuum chamber while the object is housed in the vacuum chamber.

14. The method according to claim 9, wherein
 a material containing diphenylamine or derivatives of diphenylamine, which are impurities, is used in at least one of the pump and a communication passage connecting the pump with the vacuum chamber.

15. The method according to claim 9, wherein
 the temperature in the vacuum chamber is at least 20° C. and at most 35° C.

16. A method for manufacturing an organic thin-film element, the method comprising:
 reducing an internal pressure of a vacuum chamber by using a pump while an intermediate product of the organic thin-film element, which is in an intermediate stage of a manufacturing process, is housed in the vacuum chamber; and
 ventilating inside the vacuum chamber by introducing a gas into the vacuum chamber and discharging the gas from the vacuum chamber, wherein
 in the ventilating,
  a discharge rate at which molecules of the gas per unit volume are discharged is at least $3.3 \times 10^{-5}$ mol/(s·L), and
  a temperature in the vacuum chamber is at least 15° C. and at most 55° C.

17. The method according to claim 16, wherein
 the organic thin-film element includes a substrate and an organic functional film formed on the substrate, and
 the intermediate product is the substrate on which an organic applied film, which contains a solvent and an organic material for the organic functional film, has been formed.

18. The method according to claim 16, wherein
 a material containing diphenylamine or derivatives of diphenylamine, which are impurities, is used in at least one of the pump and a communication passage connecting the pump with the vacuum chamber.

19. The method according to claim 16, wherein the organic thin-film element is used in an organic EL display panel.

20. The method according to claim 16, the temperature in the vacuum chamber is at least 20° C. and at most 35° C.

* * * * *